United States Patent
You et al.

(10) Patent No.: US 11,463,090 B2
(45) Date of Patent: Oct. 4, 2022

(54) TOUCH KEYBOARD AND KEYBOARD TOUCH ELECTRODE MODULE

(71) Applicant: DARFON ELECTRONICS CORP., Taoyuan (TW)

(72) Inventors: Wei-Yan You, Taoyuan (TW); Chin-Lung Chan, Taoyuan (TW); Po-Yueh Chou, Taoyuan (TW)

(73) Assignee: DARFON ELECTRONICS CORP., Taoyuan (TW)

(*) Notice: Subject to any disclaimer, the term of this patent is extended or adjusted under 35 U.S.C. 154(b) by 0 days.

(21) Appl. No.: 17/308,990

(22) Filed: May 5, 2021

(65) Prior Publication Data
US 2021/0351774 A1 Nov. 11, 2021

Related U.S. Application Data

(60) Provisional application No. 63/105,911, filed on Oct. 27, 2020, provisional application No. 63/022,589, filed on May 11, 2020.

(30) Foreign Application Priority Data

Dec. 15, 2020 (TW) .................................. 109144152

(51) Int. Cl.
*H03K 17/96* (2006.01)
*G06F 3/044* (2006.01)
*G06F 3/02* (2006.01)

(52) U.S. Cl.
CPC ....... *H03K 17/9622* (2013.01); *G06F 3/0202* (2013.01); *G06F 3/0445* (2019.05); *G06F 3/0446* (2019.05)

(58) Field of Classification Search
CPC . H03K 17/9622; G06F 3/0202; G06F 3/0445; G06F 3/0446; H01H 13/00
See application file for complete search history.

(56) References Cited

U.S. PATENT DOCUMENTS 4,246,452 A 1/1981 Chandler
6,204,839 B1 3/2001 Mato, Jr.
(Continued)

FOREIGN PATENT DOCUMENTS

CN 1217359 C 8/2005
CN 101174511 A 5/2008
(Continued)

OTHER PUBLICATIONS

You, the specification, including the claims, and drawings in the U.S. Appl. No. 17/316,737, filed May 11, 2021.
(Continued)

*Primary Examiner* — Amit Chatly
(74) *Attorney, Agent, or Firm* — Winston Hsu

(57) ABSTRACT

A touch keyboard includes a keyboard touch electrode module and keyswitches arranged along lengthwise and widthwise directions. The keyboard touch electrode module includes plural key electrode matrixes one-to-one corresponding to plural key projection areas for the keyswitches. The key electrode matrixes are arranged along the lengthwise direction and the widthwise direction. At least two key electrode matrixes unaligned in the widthwise direction are identical to each other. The key electrode matrix includes plural electrodes arranged alternately at an electrode interval. A size of the electrode in the widthwise direction is defined by a function of the electrode interval, a key pitch between two widthwise-adjacent ones of the key projection areas, and an electrode row number covered within the key pitch.

20 Claims, 23 Drawing Sheets

(56) References Cited

U.S. PATENT DOCUMENTS

| | | |
|---|---|---|
| 6,924,789 B2 | 8/2005 | Bick |
| 8,760,273 B2 | 6/2014 | Casparian |
| 9,230,753 B2 | 1/2016 | Chen |
| 9,612,666 B2 | 4/2017 | Cho |
| 10,289,238 B2 | 5/2019 | Lee |
| 10,585,493 B2 | 3/2020 | Elias |
| 10,656,714 B2 | 5/2020 | Ligtenberg |
| 2010/0148995 A1* | 6/2010 | Elias ............... G06F 3/0488 178/18.03 |
| 2011/0012845 A1* | 1/2011 | Rothkopf ............ G06F 3/0446 345/173 |
| 2012/0306756 A1 | 12/2012 | Lin |
| 2013/0135211 A1 | 5/2013 | Chiang |
| 2014/0034472 A1 | 2/2014 | Krumpelman |
| 2016/0139317 A1 | 5/2016 | Tai |
| 2016/0196936 A1 | 7/2016 | Ding |
| 2018/0217668 A1 | 8/2018 | Ligtenberg |
| 2020/0012354 A1* | 1/2020 | Cho ................. G06F 3/0202 |

FOREIGN PATENT DOCUMENTS

| | | |
|---|---|---|
| CN | 202600625 U | 12/2012 |
| CN | 203179767 U | 9/2013 |
| CN | 109871063 A | 6/2019 |
| CN | 110968200 A | 4/2020 |
| EP | 3 477 438 A1 | 5/2019 |
| TW | M422104 U1 | 2/2012 |
| TW | M430652 U1 | 6/2012 |
| TW | 201310279 A1 | 3/2013 |
| TW | I465964 B | 12/2014 |
| TW | I545494 B | 8/2016 |
| TW | 201926009 A | 7/2019 |

OTHER PUBLICATIONS

Chan, the specification, including the claims, and drawings in the U.S. Appl. No. 17/195,585, filed Mar. 8, 2021.

* cited by examiner

TOUCH KEYBOARD AND KEYBOARD TOUCH ELECTRODE MODULE

CROSS REFERENCE TO RELATED APPLICATIONS

This application claims the benefit of U.S. Provisional Application No. 63/022,589, which was filed on May 11, 2020, claims the benefit of U.S. Provisional Application No. 63/105,911, which was filed on Oct. 27, 2020, and is incorporated herein by reference.

BACKGROUND OF THE INVENTION

1. Field of the Invention

The present invention relates to a touch keyboard, and more specifically, to a touch keyboard having a keyboard touch electrode module in which at least two key projection areas unaligned in a widthwise direction respectively correspond to two same key electrode matrixes.

2. Description of the Prior Art

A keyboard is mainly applied to inputting text signals to a computer system. After many years of development and integration, a keyswitch layout on the keyboard has been gradually standardized.

On the other hand, a touch pad can provide a user with a different way to perform input operations of the computer system by one-touch or multi-touch. Today, a touch function has been successfully integrated into a display monitor. However, an attempt to integrating a touch function into the keyboard without the touch pad cannot achieve satisfactory results.

SUMMARY OF THE INVENTION

The present invention provides a keyboard touch electrode module including a plurality of first electrode rows and a plurality of second electrode rows. The plurality of first electrode rows has a plurality of first electrodes electrically connected to each other in series. The plurality of second electrode rows has a plurality of second electrodes electrically connected to each other in series. The plurality of first electrode rows and the plurality of second electrode rows form a plurality of key electrode matrixes jointly. The plurality of key electrode matrixes one-to-one corresponds to a plurality of key projection areas. The plurality of key electrode matrixes is arranged along a lengthwise direction and a widthwise direction. At least two key electrode matrixes unaligned in the widthwise direction are identical to each other. The first electrodes and the second electrodes are arranged alternately at an electrode interval. A size of the first electrode in the widthwise direction is defined by a function of a key pitch of the key projection areas, the electrode interval, and an electrode row number covered within the key pitch.

The present invention further provides a keyboard touch electrode module for sensing a non-pressed movement of an object above a plurality of keyswitches. The keyboard touch electrode module includes a plurality of first electrode rows and a plurality of second electrode rows. The plurality of second electrode rows is arranged alternately with the plurality of first electrode rows to form a plurality of key electrode matrixes arranged along a lengthwise direction and a widthwise direction. Each said key electrode matrix corresponds to a key projection area. Two said key electrode matrixes and two said key projection areas adjacent in the widthwise direction shift away from each other along the lengthwise direction without being aligned along the widthwise direction. At least two said key electrode matrixes unaligned in the widthwise direction are identical to each other. At least one portion of the first electrode row or the second electrode row is an oblique electrode connection.

The present invention further provides a touch keyboard including a plurality of keyswitches and a keyboard touch electrode module. The plurality of keyswitches is arranged along a lengthwise direction and along a widthwise direction into at least two rows, wherein two said keyswitches adjacent in the widthwise direction shift away from each other along the lengthwise direction without being aligned along the widthwise direction, each said keyswitch having a keycap corresponding to a key projection area, and a mechanical movement of the keycap occurs to generate a text signal when the keycap is pressed. The keyboard touch electrode module is disposed among at least one portion of the key projection areas of the keyswitches, for sensing a capacitance sensing value of a non-pressed movement of an object above the keycaps of the plurality of keyswitches to generate a touch signal. The keyboard touch electrode module includes a plurality of first electrode rows and a plurality of second electrode rows. The plurality of first electrode rows has a plurality of first electrodes electrically connected to each other in series, wherein two first electrode rows adjacent in the lengthwise direction are parallel to each other. The plurality of second electrode rows has a plurality of second electrodes electrically connected to each other in series, wherein two second electrode rows adjacent in the widthwise direction are parallel to each other, and said first electrode rows and said second electrode rows form a plurality of key electrode matrixes jointly. At least two adjacent key projection areas unaligned in the widthwise direction, respectively correspond to two said key electrode matrixes identical to each other. Sizes of said first electrodes and said second electrodes are defined by an electrode interval and a key pitch within the key projection area.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to integrating a touch electrode layer into a computer keyboard reliably. In an ideal condition that the keyboard has a plurality of keyswitches which has the same size and is arranged orderly in a matrix, a membrane board usually has a pair of triggering electrodes corresponding to each keyswitch. If a keyboard touch electrode module having X-Y axial electrodes arranged orderly in a matrix is disposed under the keyswitch, the keyswitch can trigger the pair of triggering electrodes via a rubber dome to generate a text signal (i.e. a signal for inputting alphabet/number/symbol) for performing a corresponding input function when the keyswitch is pressed. When a user does not press the keyswitch, the keyboard touch electrode module can sense a capacitance sensing value generated by a non-pressed movement above the keyswitches (e.g. a one-point or multi-point touch/click/drag operation performed by the user) to generate a touch signal for performing a corresponding touch function.

However, in a case where the keyboard includes a plurality of keyswitches which has different sizes and is not arranged orderly in a matrix, the keyswitches on the keyboard are misaligned with each other according to the international standards, such as more than forty text keyswitches (i.e. square keys or alphanumeric keys). In this case, X-Y axial electrode patterns corresponding to projection areas of the keyswitches respectively are different from each other if the keyboard touch electrode module having X-Y axial electrodes arranged orderly in a matrix is directly disposed under the aforesaid keyswitches. In other words, the text keyswitches which have the same size and are misaligned with each other correspond to different X-Y axial electrode patterns. A distribution area of the text keyswitches is an area of the highest typing frequency on the keyboard, which is also the most possible area of switching to perform a touch function. However, the aforesaid different X-Y axial electrode patterns may sense different capacitances when the user performs touch operations above the aforesaid keyswitches.

Figure 1A:
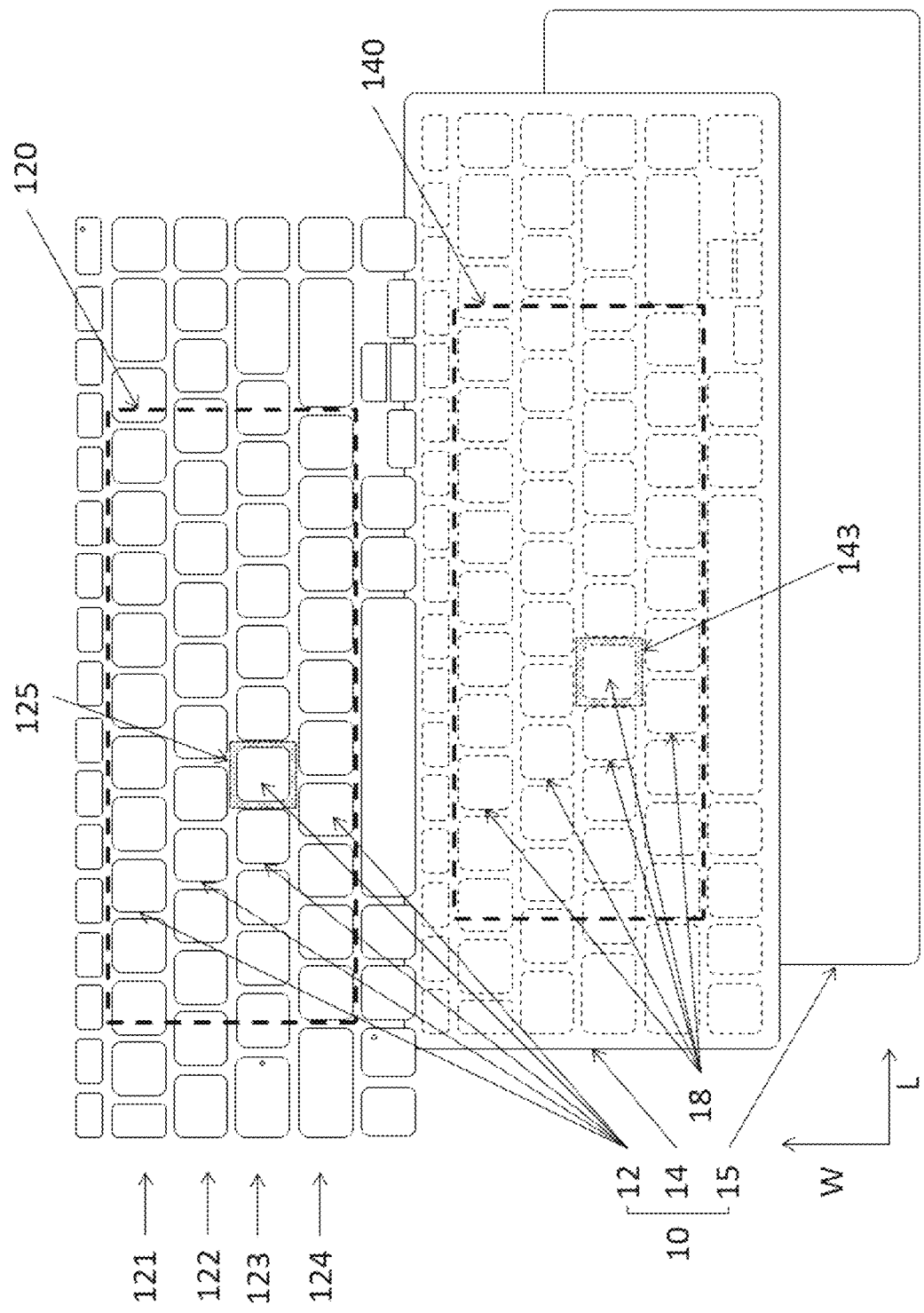
FIG. 1A is an exploded diagram of a touch keyboard according to a first embodiment of the present invention.

Besides the aforesaid different size and misalignment problems, there are other factors causing poor touch sensing efficiency of the keyboard. One is that an object O (e.g. a user's finger or a touch pen) may have different touch heights and mediums in a touch region (e.g. a touch region 120 and a touch-region projection 140 in FIGS. 1A/1B/2C/ 2E). For example, if the object O moves from a keyswitch surface to a gap between the keyswitches (e.g. a key-gap layout 125 and key-gap projection layouts 143/143a/143b as shown in FIGS. 1A/1B/2C/2E), the object O may fall into the gap (e.g. the key-gap layout 125) easily, such that the object O may have a touch height difference and a medium difference relative to the triggering electrodes (e.g. key-gap electrode patterns Mg1/Mg2 and key-face electrode patterns Mf1/Mf2 on keyboard touch electrode modules 14/52/102/ 152/202/252/302/352/402/452/502/552/602/652/702/752 according to the following embodiments) when the object O moves to the keyswitch surface and the gap respectively. As such, touch sensing data may be varied greatly to cause it hard to calibrate a threshold (e.g. a specific capacitance sensing value) of triggering a touch signal for each keyswitch. The aforesaid medium could include air medium (or an additional keyboard frame), and there are plural keyswitch components disposed under the keyswitch surface for making the keyswitch movable upward and downward. The other one is through holes on touch electrodes. Since it is necessary to make a keyboard frame or keyswitch components pass through the touch electrodes, variability of the touch sensing data may remain high if the through holes have different forming positions and different sizes to make the touch electrodes have different shapes and different sizes. Since it is hard to customize a touch region of each keyswitch, it may cause the problem that false trigger or trigger failure occurs at different positions on each text keyswitch. Thus, it may pose a great challenge to homogenize or regularize touch sensing of each keyswitch. The present invention can solve the aforesaid problems according to the following embodiments.

Figure 1B:
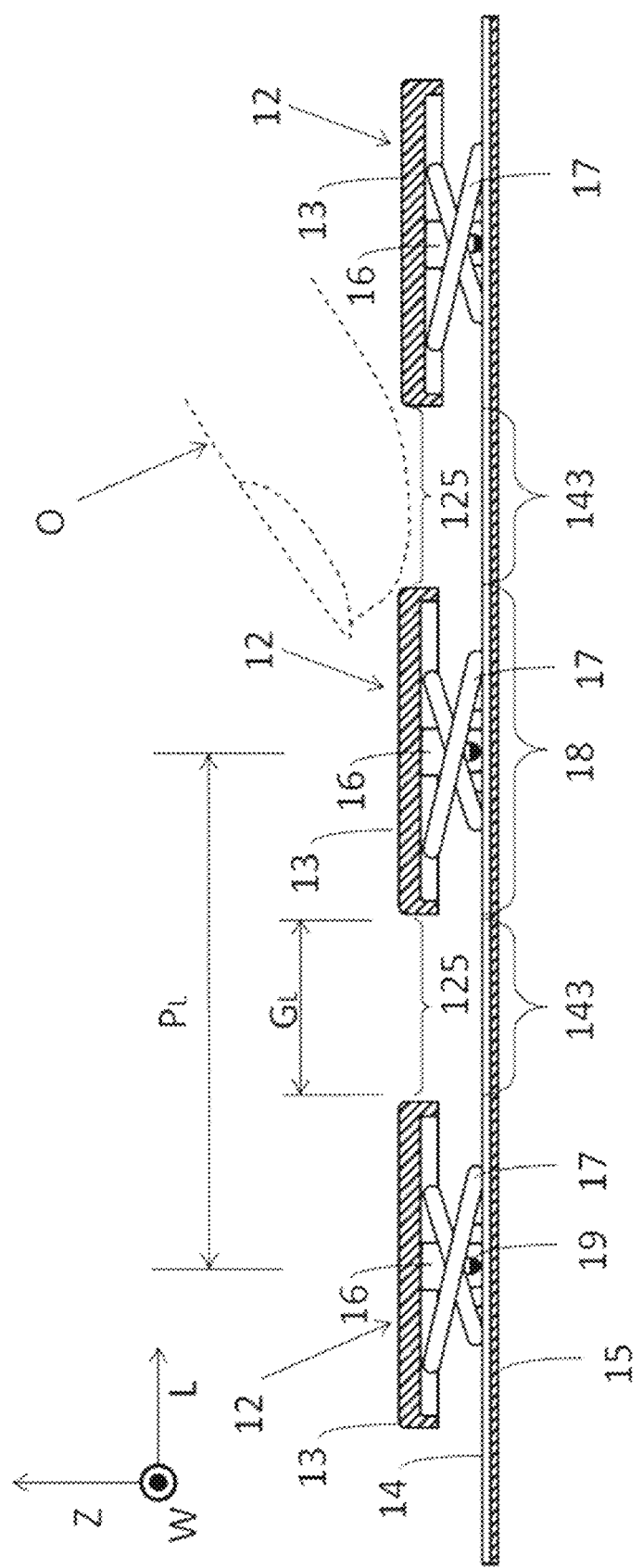
FIG. 1B is a partial cross-sectional diagram of the touch keyboard according to the first embodiment of the present invention.
Figure 2A:
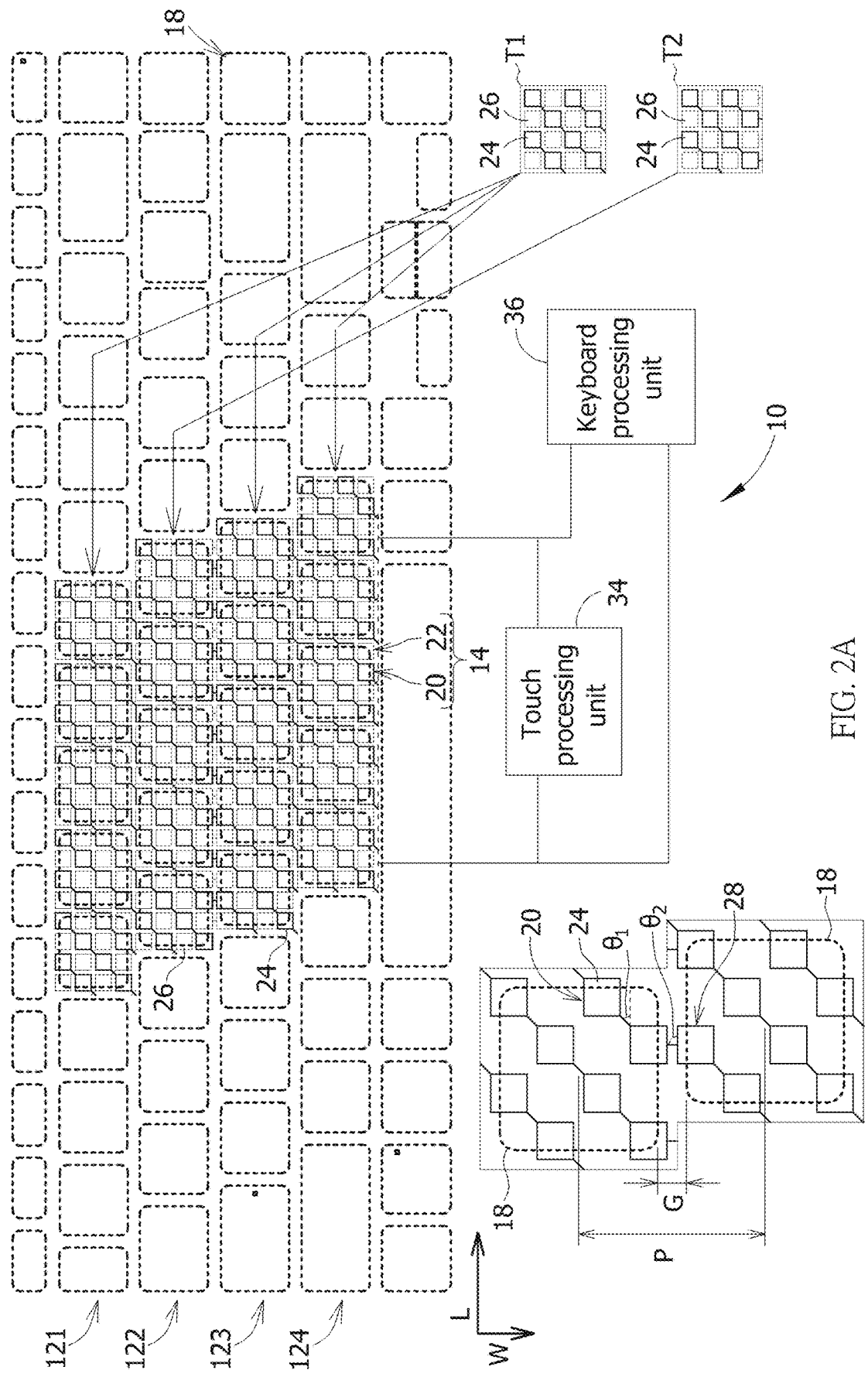
FIG. 2A is a diagram of a keyboard touch electrode module in FIGS. 1A/1B.
Figure 2B:
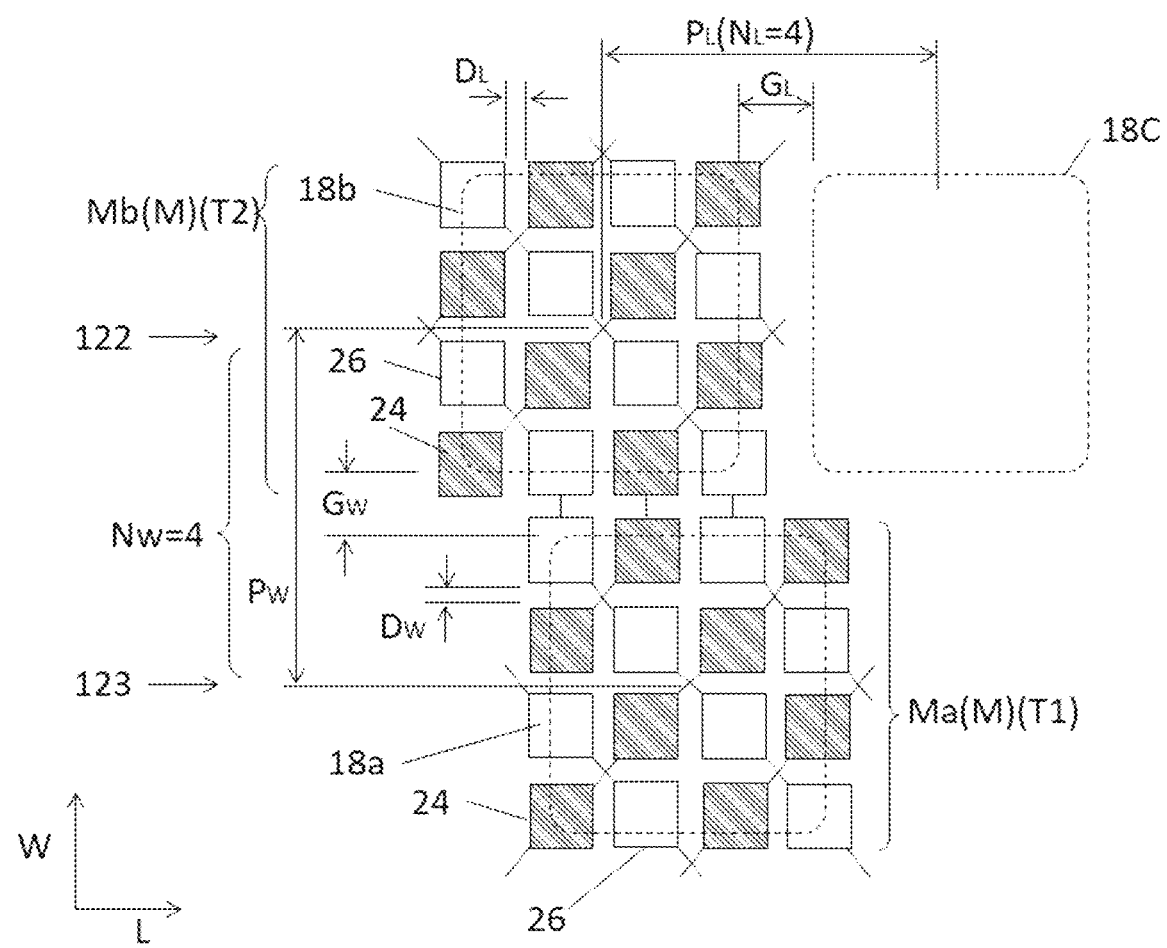
FIG. 2B is an enlarged diagram of two key electrode matrixes in FIG. 2A.
Figure 2C:
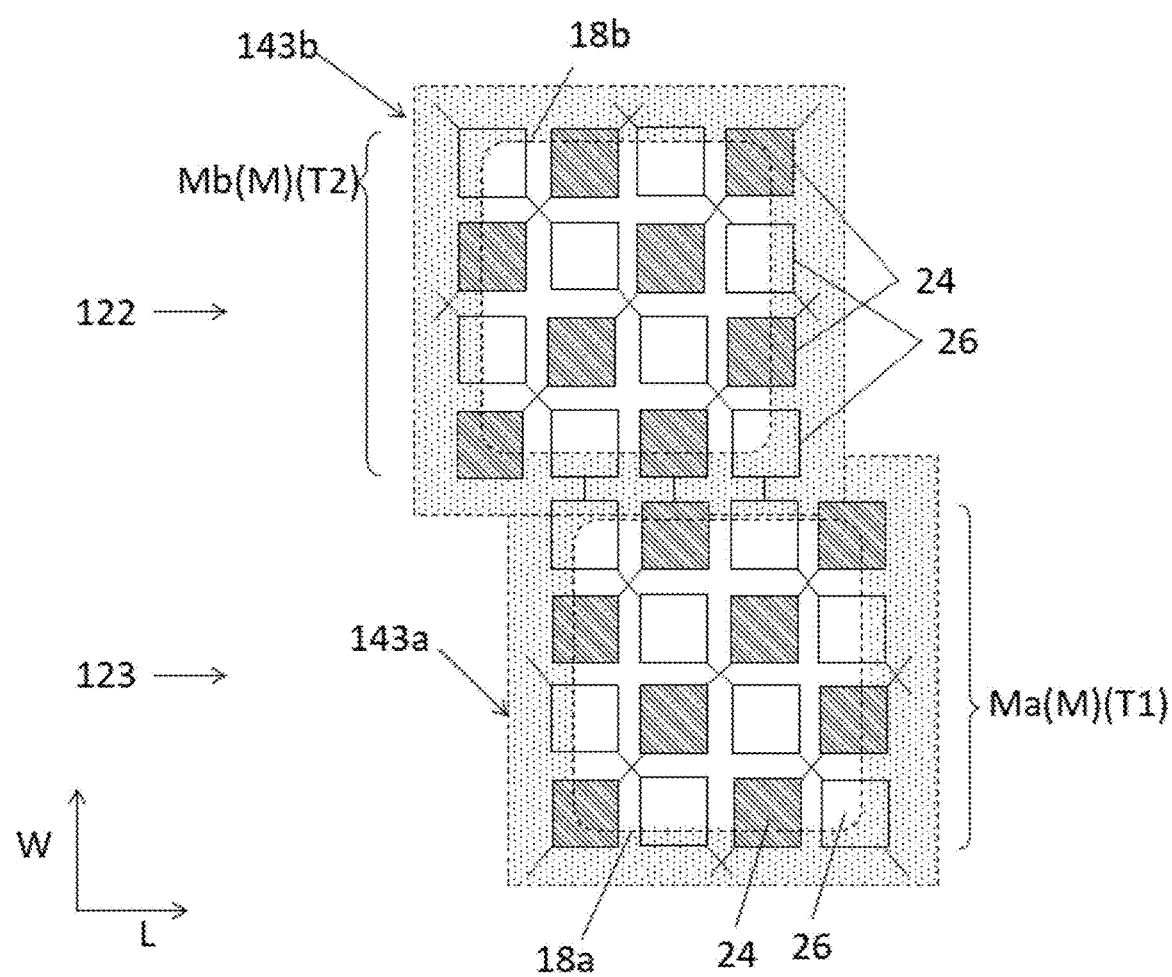
FIG. 2C is an enlarged diagram of a key-gap projection layout in FIG. 1A.
Figure 2D:
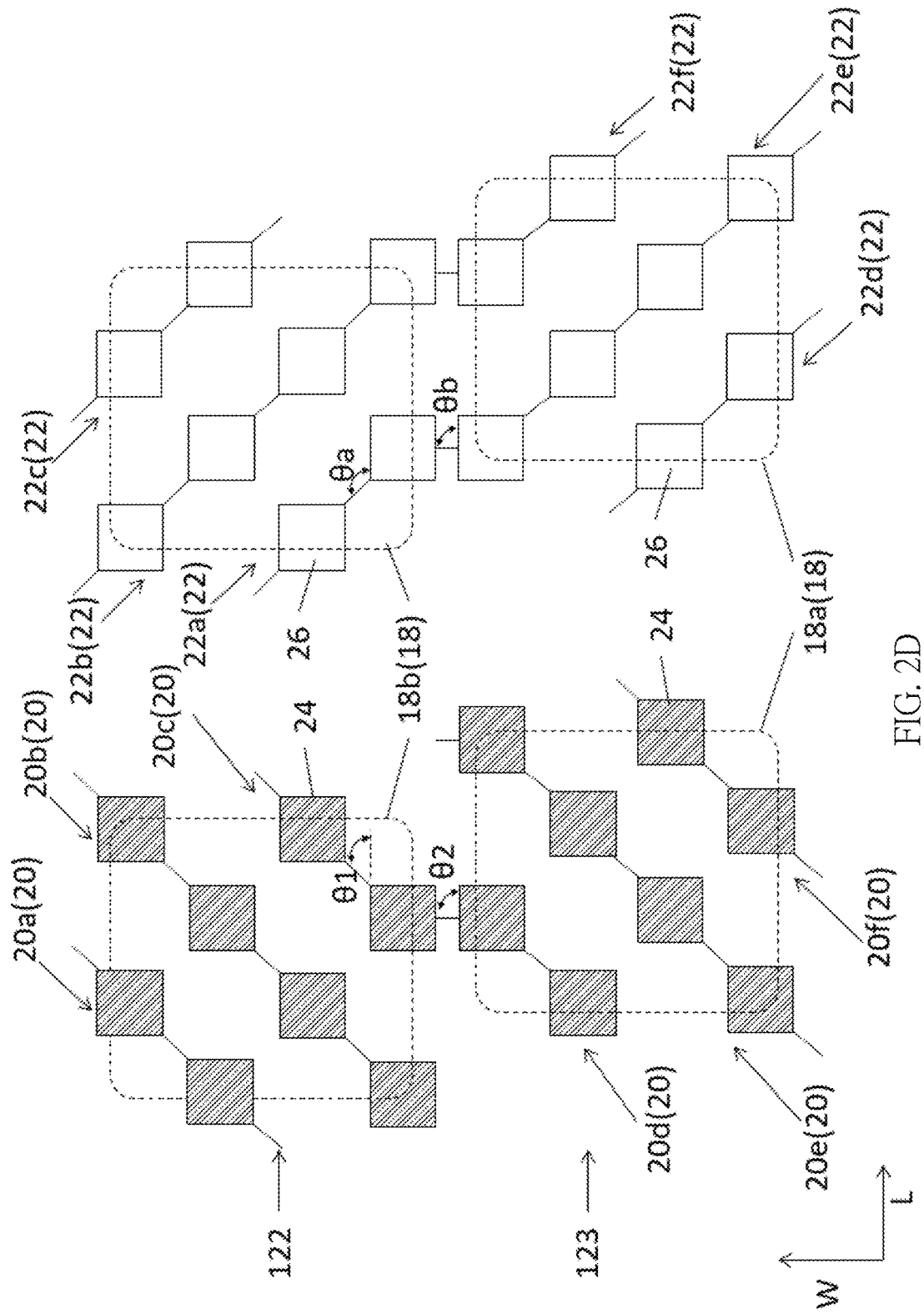
FIG. 2D is an exploded diagram of two key electrode matrixes in FIG. 2C being divided into plural first electrode rows and plural second electrode rows.
Figure 2E:
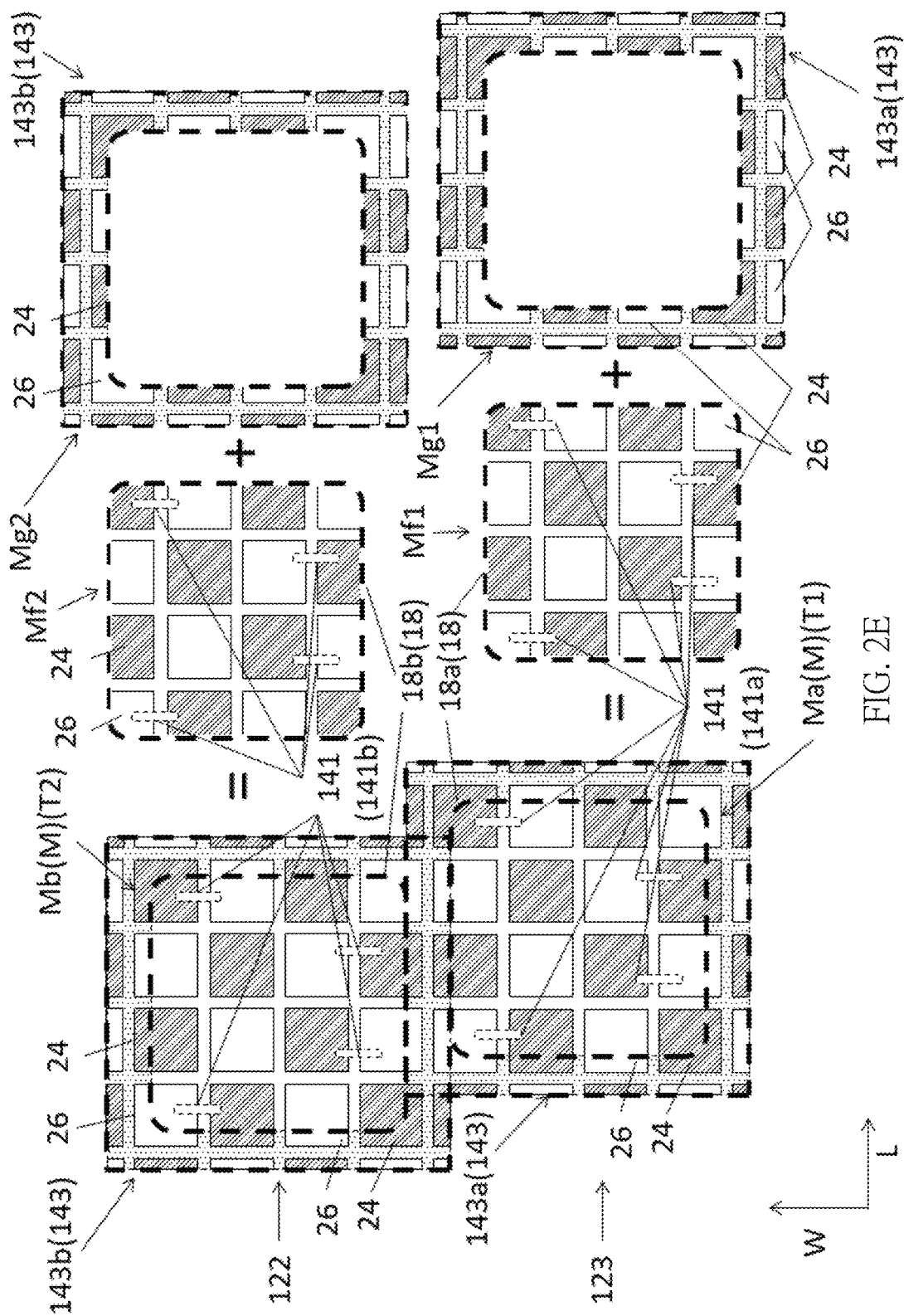
FIG. 2E is a combined diagram of key-face electrode patterns and key-gap electrode patterns of the two key electrode matrixes in FIG. 2C.

Please refer to FIGS. 1A, 1B, 2A, 2B, 2C, 2D and 2E. FIG. 1A is an exploded diagram of a touch keyboard 10 according to a first embodiment of the present invention. FIG. 1B is a partial cross-sectional diagram of the touch keyboard 10 according to the first embodiment of the present invention. FIG. 2A is a diagram of the keyboard touch electrode module 14 in FIGS. 1A/1B. FIG. 2B is an enlarged diagram of two key electrode matrixes M/Ma/Mb in FIG. 2A. FIG. 2C is an enlarged diagram of a key-gap projection layout 143 in FIG. 1A. FIG. 2D is an exploded diagram of two key electrode matrixes Ma/Mb in FIG. 2C being divided into plural first electrode rows 20 and plural second electrode rows 22. FIG. 2E is a combined diagram of key-face electrode patterns Mf1/Mf2 and key-gap electrode patterns Mg1/Mg2 of the two key electrode matrixes Ma/Mb in FIG. 2C. For clearly showing the corresponding relationships of the electrode layout of the keyboard touch electrode module 14, a plurality of key projection areas 18, a plurality of key electrode matrixes M/Ma/Mb, a primary matrix layout T1, and a secondary matrix layout T2, there are only the electrode layout of the keyboard touch electrode module 14 and the key projection areas 18 depicted on the touch keyboard 10, and the keyboard touch electrode module 14 is briefly depicted by the key electrode matrixes M corresponding to the keyswitches 12 adopting the misalignment design.

As shown in FIGS. 1A, 1B, 2A, 2B, 2C, 2D, and 2E, the touch keyboard 10 includes a plurality of keyswitches 12, the keyboard touch electrode module 14, and a board 15 stacked from up to down. Each keyswitch 12 includes a keycap 13, the board 15, and a support structure 17 connected to the keycap 13 and the board 15. The keyboard touch electrode module 14 is located under the plurality of keyswitches 12 and includes a plurality of key electrode matrixes M/Ma/Mb arranged adjacent to each other and coupled to each other. The aforesaid key electrode matrixes one-to-one correspond to the plurality of key projection areas 18, and the plurality of key projection areas 18 one-to-one corresponds to the plurality of keyswitches 12. The plurality of key electrode matrixes M/Ma/Mb is arranged along a lengthwise direction L and a widthwise direction W. In the present invention, the keyboard touch electrode module 14 could be selectively located above the board 15 made of metal material (or conductor material) or located above (or under) the board 15 made of non-metal material (or non-conductor material). Some of the keyswitches 12 are text keys having the same size (e.g. single-size keys, square keys, or alphanumeric keys) for generating text signals for inputting English alphabets, numbers, or symbols. The remaining keyswitches 12 are disposed around the square keys, such as small keys or multi-size keys. Generally, function keys located at the foremost row (e.g. ESC/F1~F12) are small keys, and space/Enter/Shift/CapsLock/Ctrl keys are multi-size keys.

In this embodiment, the keyswitches 12, the corresponding key projection areas 18/18a/18b, and the corresponding key electrode matrixes M/Ma/Mb are arranged along the lengthwise direction L, and are arranged along the widthwise direction W in at least two rows (four rows shown in FIG. 2A, but not limited thereto). Each keyswitch 12 has the keycap 13. Each keycap 13 corresponds to one key projection area 18/18a/18b/18c depicted by dotted lines in FIGS. 2A/2B/2C/2D/2E. Each key projection area 18/18a/18b/18c is a contour projection area of each keyswitch 12 or each keycap 13 along a vertical direction Z. The plurality of key projection areas 18/18a/18b could be defined on the keyboard touch electrode module 14 or any plane parallel to the keyboard touch electrode module 14. The layout of the plurality of key projection areas 18/18a/18b in the lengthwise direction L and the widthwise direction W corresponds to the layout of the plurality of keyswitches 12 in the lengthwise direction L and the widthwise direction W.

To be more specific, each keyswitch 12 includes the keycap 13, the board 15, the support structure 17 (e.g. a pair of scissor frames, but not limited thereto) connected to the keycap 13 and the board 15, and an elastic body 16 (e.g. a rubber dome or a compressed spring, but not limited thereto) as a returning member. Accordingly, when the keycap 13 is pressed, mechanical movement of the keycap 13 occurs via the support structure 17 to trigger the triggering electrodes (e.g. a first triggering electrode 30 and a second triggering electrode 32 in FIG. 3) of the keyboard touch electrode module 14, so as to generate a corresponding text signal for performing a desired input function. The keyboard touch electrode module 14 is disposed opposite to the board 15 (e.g. parallel to the board 15 or stacked on the board 15) and is disposed in at least one portion of the key projection areas 18 of the keyswitches 12 (as shown in FIG. 2A). As such, the keyboard touch electrode module 14 can sense a capacitance sensing value of a non-pressed movement of the object O (e.g. a user's finger or a touch pen) above the keycaps 13 to generate a touch signal, so as to perform a desired touch function.

More detailed description for the electrode arrangement design of the keyboard touch electrode module 14 is provided as follows. The keyboard touch electrode module 14 could be made of one-layer or multi-layer sheet having electrodes and sensing circuits printed thereon. As shown in FIGS. 2A/2B/2C/2D/2E, the keyboard touch electrode module 14 includes a plurality of first electrode rows 20 and a plurality of second electrode rows 22. The plurality of first electrode rows 20 has a plurality of first electrodes 24 electrically connected to each other in series. Two first electrode rows 20 adjacent in the lengthwise direction L are parallel to each other. The plurality of second electrode rows 22 has a plurality of second electrodes 26 electrically connected to each other in series. Two second electrode rows 22 adjacent in the lengthwise direction L are parallel to each other. As shown in FIGS. 2A/2B/2C/2D/2E, a pair of first electrodes 24 and a pair of second electrodes 26 adjacent in each key projection area 18 are arranged alternately and symmetrically relative to the center of the key projection area 18. Furthermore, as shown in FIGS. 2A/2B/2C/2D/2E (the second electrode row 22 is omitted for clearly showing the electrode arrangement angle of the first electrode row 20), each first electrode row 20 is an oblique electrode row along a first primary angle $\theta_1$ and includes at least one first shift section 28 arranged along a first secondary angle $\theta_2$. To be noted, the aforesaid electrode arrangement design of the first electrode row 20 could be applied to the second electrode row 22, and the related description could be reasoned by analogy according to the aforesaid description and FIGS. 2A/2B/2C/2D/2E and omitted herein. In practical application, the first and second electrode rows 20, 22, the key electrode matrixes Ma/Mb, or the first electrode sections 20a/20b/20c/20d/20e/20f and the second electrode sections 22a/22b/22c/22d/22e/22f could be arranged symmetrically relative to a geometric center of the key projection area 18, but the present invention is not limited thereto.

In this embodiment, for uniformity or low variability of touch sensing of the keyswitches 12 having the single-key size, the first electrode 24 and the second electrode 26 have the same shape (e.g. a rectangle or rhombus shape) or size (e.g. having the same side length of a rectangle electrode or the same diagonal length of a rhombus electrode). The electrode intervals of the first electrodes 24 and the second electrodes 26 in the widthwise direction W are equal to each other, and the electrode intervals of the first electrodes 24 and the second electrodes 26 in the lengthwise direction L are equal to each other (but the present invention is not limited thereto). For the rectangle electrode, the electrode interval refers to an interval between two parallel adjacent sides of two adjacent electrodes. For the rhombus electrode, the electrode interval refers to an interval between two opposite protruding edges of two adjacent rhombus electrodes. In this embodiment, the first electrode 24 and the second electrode 26 could be preferably rectangle shaped, and adjacent sides of each first electrode 24 and each second electrode 26 are parallel to each other. To be more specific, each first electrode 24 is aligned with the adjacent second electrode 26 in the lengthwise direction L, and each first electrode 24 is aligned with the adjacent second electrode 26 in the widthwise direction W.

Each keyswitch 12 (i.e. a square key, a small key, or a multi-size key) corresponds to one key projection area 18. The key projection areas 18 could be arranged along the lengthwise direction L in a plurality of lines and arranged along the widthwise direction W in a plurality of rows. As shown in FIGS. 1A/1B/2A/2B/2C/2D/2E, the plurality of keyswitches 12 is arranged, for example, according to some international standards. The plurality of keyswitches 12 includes a first keyswitch row 121, a second keyswitch row 122, a third keyswitch row 123, and a fourth keyswitch row 124 (in FIGS. 2A/2B/2C, the positions of the key projection areas 18/18a/18b could correspond to the positions of the keyswitches 12, meaning that arrangement of the key projection areas 18/18a/18b could be regarded as arrangement of the keyswitches 12). According to some international standards, the square keys (i.e. the keyswitches 18) of the first keyswitch row 121, the second keyswitch row 122, the third keyswitch row 123, and the fourth keyswitch row 124 are misaligned with each other. For example, the square key (i.e. the keyswitch 18) of the second keyswitch row 122 is shifted a half of a key pitch P (the related definition is provided as follows) rightward (i.e. in the lengthwise direction L) from the square key (i.e. the keyswitch 18) of the first keyswitch row 121. The square key (i.e. the keyswitch 18) of the third keyswitch row 123 is shifted a quarter of the key pitch P rightward (i.e. in the lengthwise direction L) from the square key (i.e. the keyswitch 18) of the second keyswitch row 122. The square key (i.e. the keyswitch 18) of the fourth keyswitch row 124 is shifted a half of the key pitch P rightward (i.e. in the lengthwise direction L) from the square key (i.e. the keyswitch 18) of the third keyswitch row 123. In summary, in the first keyswitch row 121/the second keyswitch row 122/the third keyswitch row 123/the fourth keyswitch row 124, the key electrode matrixes M/Ma/Mb corresponding to the key projection areas 18 of the square keyswitches 12 are misaligned with each other, meaning that any two key projection areas 18 or any two key electrode matrixes M/Ma/Mb (corresponding to the square keys) adjacent in the widthwise direction W are shifted away from each other along the lengthwise direction L without being aligned along the widthwise direction W.

According to the aforesaid arrangement, the electrode size equation disclosed by the present invention can relate to a multiple (e.g. 2 or 4) of the ratio of the key pitch P to the shifted distance, which means the electrode size of the present invention could be a function of the multiple of the ratio of the key pitch P to the shifted distance. The electrode number of the key projection area 18 corresponding to the square key in the lengthwise direction L (i.e. an electrode row number N corresponding to the key pitch P) could be a least common multiple of the ratio of the key pitch P to the shifted distance in the first keyswitch row 121, the second keyswitch row 122, the third keyswitch row 123 or the fourth keyswitch row 124, or could be a multiple of the least common multiple (but not limited thereto). Even if the electrode size does not directly relate to the multiple of the ratio of the key pitch P to the shifted distance, the touch sensing regularity of each square key portion in the plurality of keyswitches 12 can be still improved as long as at least two key projection areas 18 unaligned along the widthwise direction W can respectively correspond to two same key electrode matrixes (e.g. Ma/Mb) in the keyboard touch electrode module 14.

Furthermore, the sizes of the first electrode 24 and the second electrode 26 could be preferably a function defined by an electrode interval between two adjacent electrodes (the first electrode 24 and/or the second electrode 26), an electrode row number corresponding to the key projection area 18/the key electrode matrix Ma/Mb, and a key pitch. To be more specific, according to the experimental results, the size of the first electrode 24 in the widthwise direction W (e.g. a side length in the widthwise direction W) can be calculated according to the following equation.

$$w=[P-(D*N)]/N;$$

wherein P represents a key pitch ($P_W$ or $P_L$) of two adjacent key projection areas 18 (or the two adjacent key electrode matrixes Ma/Mb in FIG. 2B) in the widthwise direction W; D represents an electrode interval $D_W$ of two adjacent electrodes (i.e. two first electrodes 24, two second electrodes 26, or first and second electrodes 24 and 26) in the widthwise direction W (or an electrode interval $D_L$ in the lengthwise direction L); N represents an electrode row number $N_W$ corresponding to the key pitch P in the widthwise direction W (or an electrode line number $N_L$ corresponding to the key pitch P in the lengthwise direction L); w represents a side length of a first electrode 24 in the widthwise direction W. In other words, the side length w of the first electrode 24 in the widthwise direction W is equal to the quotient of the difference of the key pitch P and the product of the electrode row number N and the electrode interval D divided by the electrode row number N.

To be noted, since two adjacent key electrode matrixes M/Ma/Mb are continuously arranged at the electrode interval and the keyboard touch electrode module 14 usually has the same or similar electrode interval, the electrode row number N could be also regarded as an electrode row or line number corresponding to one single side of the key projection area 18 (or the key electrode matrix Ma/Mb). As shown in FIG. 2B, the electrode row number of the key electrode matrix Ma/Mb is equal to 4, which also means that the electrode row number N corresponding to the key pitch P is equal to 4.

In the present invention, it is assumed that each electrode interval between the first and second electrodes 24, 26, two adjacent first electrodes 24, or two adjacent second electrodes 26 is equal to each other in the same direction and the sizes of first electrode 24 and the second electrode 26 are equal to each other. For example, the size of any electrode in the widthwise direction W could be a function of the key pitch $P_W$ of the key projection area 18, the electrode interval $D_W$, and the electrode row number $N_W$ corresponding to each key electrode matrix Ma/Mb (or the key pitch $P_W$). Similarly, the size of any electrode in the length direction L could be a function of the key pitch $P_L$ of the key projection area 18, the electrode interval $D_L$, and the electrode line number $N_L$ corresponding to each key electrode matrix Ma/Mb (or the key pitch $P_L$). In summary, for the first electrode 24 and the second electrode 26 having the same shape (e.g. a rectangle or rhombus shape), the sizes of the first electrode 24 and the second electrode 26 in the lengthwise directions L and the widthwise direction W can be calculated according to the aforesaid equation.

As shown FIGS. 1A/1B, the touch keyboard 10 further includes a touch region 120 for the object O (e.g. a user's finger or a touch pen) to perform touch operations. The touch region 120 at least includes a top side area of the square keyswitches 12 and a covering area of a plurality of key-gap layouts 125. Each key-gap layout 125 surrounds one corresponding keyswitch 12. As shown in FIGS. 1A/1B/2A/2B/2C/2D/2E, in the keyboard touch electrode module 14, the touch region 120 corresponds to a touch-region projection 140, and the touch-region projection 140 at least corresponds to the key projection areas 18/18a/18b/18c of the square keyswitches 12 and a plurality of key-gap projection layouts 143/143a/143b. The touch-region projection 140 could be regarded as a projection of the touch region 120 along the vertical direction Z. The touch-region projection 140 could be larger than, smaller than, or equal to the key projection areas 18/18a/18b/18c of the square keyswitches 12, meaning that the touch-region projection 140 could have a boundary in a rectangle shape or an irregular shape. Each key-gap projection layout 143/143a/143b surrounds one corresponding key projection area 18/18a/18b/18c. At least two adjacent square keyswitches 12 unaligned in the widthwise direction W in the touch region 120 respectively correspond to two same key electrode matrixes Ma/Mb in FIGS. 2B/2C/2D/2E, and at least one of the two same key electrode matrixes Ma/Mb corresponding to the at least two adjacent square keyswitches 12 includes at least one oblique electrode connection.

In the present invention, the oblique electrode connection means two electrodes are obliquely coupled to each other and the line of the centers of the two electrodes is oblique without being parallel to the widthwise direction W or the lengthwise direction L. On the contrary, a straight electrode connection means two electrodes are straightly coupled to each other and the line of the centers of the two electrodes is straight and is parallel to the widthwise direction W or the lengthwise direction L. In FIGS. 2B/2C/2D/2E, the key electrode matrix Ma includes three first electrode sections 20a/20b/20c which are a portion of one first electrode row 20 respectively, and three second electrode sections 22a/22b/22c which are a portion of one second electrode row 22 respectively. The first electrode sections 20a/20b/20c and the second electrode sections 22a/22b/22c are arranged alternately. The key electrode matrix Mb includes three first electrode sections 20d/20e/20f, which are a portion of one first electrode row 20 respectively, and three second electrode sections 22d/22e/22f, which are a portion of one second electrode row 22 respectively.

The key electrode matrixes M/Ma/Mb correspond to the key projection areas 18a/18b respectively (symmetrically or asymmetrically). Each key electrode matrix Ma/Mb includes sixteen electrodes arranged orderly in a 4*4 matrix. Each key electrode matrix M/Ma/Mb only includes electrodes without electrical wires between the electrodes. Each key projection area 18/18a/18b could overlap with all the electrodes located at the periphery of the corresponding key electrode matrix M/Ma/Mb, which means that it is not necessary for the contour of each key projection area 18/18a/18b to be located outside all the electrodes located at the periphery of the corresponding key electrode matrix M/Ma/Mb. Although the square keyswitches 12 are unaligned in the widthwise direction W in the touch region 120, touch sensing regularity of each key projection area 18/18a/18b can be still improved if each key electrode matrix M/Ma/Mb are the same or at least two key electrode matrixes unaligned in the widthwise direction W are the same (or have some specific regularity). Furthermore, the present invention can reduce number of the touch breakpoints in the touch region of the touch keyboard, enhance touch sensitivity of the touch keyboard, and simplify the electrode design of the keyboard touch electrode module.

In FIG. 1B, the support structure 17 of each keyswitch 12 is connected to the keycap 13 and the board 15 and passes through the keyboard touch electrode module 14. In this case, a plurality of through holes 141 is defined on the keyboard touch electrode module 14 corresponding to the key projection areas 18/18a/18b, and a hole layout 141a/141b is defined by the plurality of through holes 141. As shown in FIG. 2E, at least two key electrode matrixes M/Ma/Mb unaligned in the widthwise direction W are identical to each other. Each key electrode matrix M/Ma/Mb unaligned in the widthwise direction W is formed by eight first electrodes 24 and eight second electrodes 26. In FIG. 2D, at least one portion of the two key electrode matrixes Ma/Mb is the oblique electrode connection, meaning that at least one portion of the first electrode sections 20a/20b/20c/20d/20e/20f (respectively a portion of six first electrode rows 20) and the second electrode sections 22a/22b/22c/22d/22e/22f (respectively a portion of six second electrode rows 22) is the oblique electrode connection. In FIG. 2E, at least two key electrode matrixes Ma/Mb unaligned in the widthwise direction W have the same hole layout 141a/141b respectively. That is, the key electrode matrixes Ma/Mb have the through holes 141, the number, positions, shapes, sizes of which correspond to each other, so as to improve the touch sensing regularity of each key projection area 18/18a/18b or each key electrode matrix Ma/Mb. Another possibility to form the through holes on each key projection area 18/18a/18b or each key electrode matrix Ma/Mb of the keyboard touch electrode module is frame pillars, such as fixing pillars of a keyboard frame or positioning pillars in the notebook frame corresponding to the key-gap layout 125 or the key-gap projection layout 143/143a/143b, which means that the aforesaid through holes are located within the key-gap projection layout 143/143a/143b. In this condition, the two key-gap projection layout 143a/143b unaligned in the widthwise direction W could have similar touch sensing performance as long as the number, positions, shapes, sizes of the aforesaid through holes correspond to each other.

In FIG. 2E, key-gap projection layouts 143/143a/143b are defined around the two key electrode matrixes Ma/Mb unaligned in the widthwise direction W respectively, and each key-gap projection layout 143/143a/143b corresponds to a corresponding key projection area 18/18a/18b/18c. Each key-gap projection layout 143/143a/143b is basically a projection area of each key-gap layout 125 along the vertical direction Z. At least two key-gap projection layout 143/143a/143b unaligned in the widthwise direction W have the same covering area on the corresponding key electrode matrixes M/Ma/Mb. That is, each key electrode matrix Ma/Mb could be divided into at least two areas: one is the key-face electrode pattern Mf1/Mf2 corresponding to the key projection area 18a/18b, and the other is the key-gap electrode pattern Mg1/Mg2 corresponding to the key-gap projection layout 143a/143b. The key-face electrode patterns Mf1/Mf2 include sixteen electrodes 24/26 (4*4 matrix) respectively. Although the twelve electrodes 24/26 located at the periphery of the key projection area 18a/18b are incomplete electrodes (only four electrodes 24/26 located at the center portion of the key projection area 18a/18b are complete electrodes), the key-face electrode patterns Mf1/Mf2 are identical to each other since the sixteen electrodes 24/26 in the key projection area 18a are identical to the sixteen electrodes 24/26 in the key projection area 18b. Similarly, the twenty-eight incomplete electrodes 24/26 of the key-gap electrode pattern Mg1 are identical to the twenty-eight incomplete electrodes 24/26 of the key-gap electrode pattern Mg2. That is, in this embodiment, the at least two key-face electrode patterns Mf1/Mf2 unaligned in the widthwise direction W are identical to each other, or the at least two key-gap electrode patterns Mg1/Mg2 unaligned in the width direction W are identical to each other. In such a manner, when the object O is located at the key projection area 18/18a/18b, the corresponding key-face electrode pattern Mf1/Mf2 can provide a consistent touch sensing value (e.g. a consistent touch sensing capacitance) for a touch processing unit 34 to determine whether to send out a touch signal. Similarly, when the object O is located at the key-gap layout 125, the corresponding key-gap electrode pattern Mg1/Mg2 can provide a consistent touch sensing value (e.g. a consistent touch sensing capacitance) for the touch processing unit 34 to determine whether to send out a touch signal. The key-gap electrode pattern Mg1/Mg2 and the key-face electrode pattern Mf1/Mf2 only involve the shape/size/number/location/arrangement of the electrodes, which means the present invention can achieve the touch sensing regularity of each key projection area 18/18a/18b without considering whether the key electrode matrixes M/Ma/Mb are completely identical to each other as long as the first electrode and the second electrode are identical to each other in shape, size, and electrode interval (e.g. in electrode interval along the widthwise direction W or the lengthwise direction L). Similarly, it is not necessary to consider whether the key-gap electrode patterns Mg1/Mg2 or the key-face electrode patterns Mf1/Mf2 are completely identical to each other as long as the first electrode and the second electrode are identical to each other in shape, size, and electrode interval. In summary, in the touch-region projection 140 of the keyboard touch electrode module 14, the key projection areas 18/18a/18b misaligned with each other can have the same key electrode matrixes M/Ma/Mb, so as to achieve the purpose that the two key-face electrode patterns Mf1/Mf2 are identical to each other, the two key-face electrode patterns Mg1/Mg2 are identical to each other, and the two hole layouts 141a/141b are identical to each other even if the two key electrode matrixes Ma/Mb or the two key projection areas 18a/18b are unaligned in the widthwise direction W. As such, the present invention can simplify the electrode layout design of the keyboard touch electrode module and improve the touch sensing regularity of the touch keyboard. For example, in a case where each keyswitch 12 corresponds to a 4*4 electrode matrix as shown in FIGS. 2A/2B/2C/2D/2E, the present invention can calculate the side length of the first electrode 24 in the widthwise direction W according to the aforesaid equation. Similarly, the side length of the first electrode 24 in the lengthwise direction L and the side lengths of the second electrode 26 in the lengthwise direction L and the widthwise direction W can be calculated by analogy according to the aforesaid equation. Accordingly, the sizes of the first electrode 24 and the second electrode 26 can be defined, so as to make the first electrode rows 20 and the second electrode rows 22 on the keyboard touch electrode module 14 jointly form an electrode arrangement, in which each keyswitch 12 corresponds to eight first electrodes 24 and eight second electrodes 26 and these electrodes can form a 4*4 electrode matrix. In this embodiment, the first electrode row 20 could include continuous first electrodes 24 (e.g. eight first electrodes 24) arranged obliquely at a first primary angle $\theta_1$ (i.e. the oblique electrode connection). The first electrode row 20 could further include a ninth first electrode 24 arranged after the eight first electrodes 24 at the first secondary angle $\theta_2$ (in this embodiment, the two first electrodes 24 are connected to each other vertically in the widthwise direction W) to form the first shift section 28 of the first electrode row 20. Similarly, the second electrode row 22 could include continuous second electrodes 26 (e.g. eight second electrodes 26 of the two adjacent key electrode matrixes M crossing the first keyswitch row 121 and the second keyswitch row 122) arranged obliquely at a second primary angle $\theta_a$ (i.e. the oblique electrode connection). The second electrode row 22 could further include a ninth second electrode 26 arranged after the eight second electrodes 26 at the second secondary angle $\theta_b$ (in this embodiment, the two second electrodes 26 are connected to each other vertically in the widthwise direction W) to form a shift section of the second electrode row 22. As shown in a lower right portion of FIG. 2A, the 4*4 electrode matrix corresponding to each keyswitch 12 is arranged according to a primary matrix layout T1 or a secondary matrix layout T2.

The plurality of first electrode rows 20 and the plurality of second electrode rows 22 can form a plurality of primary matrix layouts T1 corresponding to the first keyswitch row 121, the third keyswitch row 123, and the fourth keyswitch row 124, and can form a plurality of secondary matrix layouts T2 corresponding to the second keyswitch row 122. As shown in FIG. 2A, a center connection angle of the two adjacent first electrodes 24 located between the secondary matrix layout T2 (corresponding to the second keyswitch row 122) and the primary matrix layout T1 (corresponding to the third keyswitch row 123) is different from a center connection angle of the two adjacent first electrodes 24 in the primary matrix layout T1.

In the present invention, the primary matrix layouts T1/T3/T5/T7/T9/T11/T13/T15/T17/T18/T19/T20/T21/T23/T25/T26 or the secondary matrix layouts T2/T4/T6/T8/T10/T12/T14/T16/T22/T24 correspond to the key electrode matrixes M/Ma/Mb. The aforesaid matrix layouts involve electrode connection and electrode arrangement, but the aforesaid key electrode matrixes only involve electrode arrangement.

Figure 3:
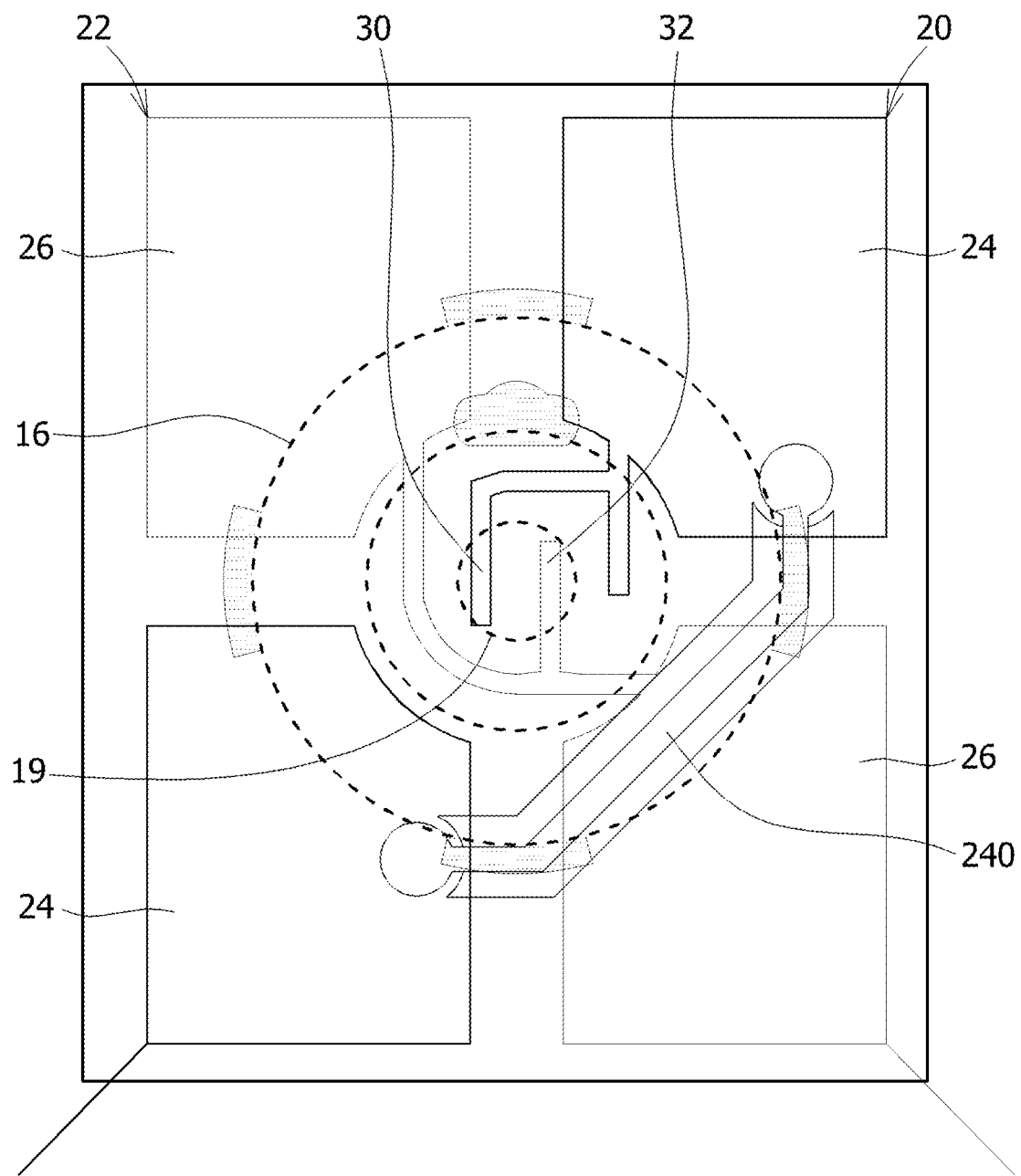
FIG. 3 is an enlarged diagram of first electrodes and second electrodes arranged alternately in a key projection area in FIG. 2A.

As for the triggering design of the keyboard touch electrode module 14, the related description could be as shown in FIGS. 1A/1B/2A/2B/2C/2D/2E/3. FIG. 3 is an enlarged diagram of the plurality of first electrodes 24 and the plurality of second electrodes 26 alternately arranged in the key projection area 18 in FIG. 2A. For clearly showing the position relationship between the elastic body 16 and triggering electrodes, the elastic body 16 and a triggering point 19 are depicted by dotted lines in FIG. 3. As shown in FIGS. 1A/1B/2A/2B/2C/2D/2E/3, a plurality of first triggering electrodes 30 and a plurality of second triggering electrodes 32 extend from the first electrode row 20 and the second electrode row 22 respectively. The first triggering electrodes 30 and the second triggering electrodes 32 are spaced away from each other near the center of the key projection area 18 and disposed on the keyboard touch electrode module 14 corresponding to the keyswitch 12. The two first electrodes 24 located at the lower left portion and the upper right portion of FIG. 3 are electrically connected to each other by a jumper wire 240. An insulation layer is formed under the jumper wire 240 to insulate the second electrode 26 from the first electrode 24 for preventing short circuit of the keyboard touch electrode module 14. The touch keyboard 10 could further include the touch processing unit 34 and a keyboard processing unit 36 (both depicted by functional blocks). The touch processing unit 34 is electrically connected to the plurality of first electrode rows 20 and the plurality of second electrode rows 22 of the keyboard touch electrode module 14 for processing the capacitance sensing values of the keyboard touch electrode module 14 and outputting the touch signals. The keyboard processing unit 36 is electrically connected to the first triggering electrode 30 and the second triggering electrode 32 of each keyswitch 12. Accordingly, when the keyswitch 12 is pressed to cause the mechanical movement of the keyswitch 12, the first triggering electrode 30 can be in contact with the second triggering electrode 32 (e.g. via the triggering point 19 of the elastic body 16) such that the keyboard processing unit 36 can generate a corresponding text signal. To be more specific, as shown in FIG. 1B and FIG. 3, in this embodiment, the elastic body 16 could have the triggering point 19 (preferably made of carbon particle material, but not limited thereto). Accordingly, when the keycap 13 is pressed, deformation of the elastic body 16 occurs with downward movement of the keycap 13, so as to move the triggering point 19 downward to trigger the first triggering electrode 30 and the second triggering electrode 32 for generating the corresponding text signal. In another embodiment, the text signal triggering design of the present invention could be achieved by a membrane board or a rigid circuit board, meaning that it is not necessary to dispose the keyboard processing unit 36, the plurality of first triggering electrodes 30, the plurality of second triggering electrodes 32, and the related circuit on the keyboard touch electrode modules 14/52/102/152/202/252/302/352/402/452/502/552/602/652/702/752 provided by the present invention.

To sum up, in the keyboard touch electrode module of the present invention, the key projection areas 18/18a/18b misaligned with each other can have the same key electrode matrixes M/Ma/Mb, so as to achieve the purpose that the two key-face electrode patterns Mf1/Mf2 are identical to each other, the two key-gap electrode patterns Mg1/Mg2 are identical to each other, and the two hole layouts 141a/141b are identical to each other even if the two key projection areas 18a/18b are unaligned in the widthwise direction W. As such, the present invention can simplify the electrode layout design of the keyboard touch electrode module and improve the touch sensing regularity of the keyboard touch electrode module, so as to greatly enhance the touch accuracy of the touch keyboard. Furthermore, via the one-layer integration design of forming the aforesaid electrode rows (for generating the touch signals by the non-pressed movement of the object above the keyswitches) and the triggering electrodes (for generating the text signals by the mechanical movements of the keyswitches) on the keyboard touch electrode module, the present invention can reduce the thickness of the circuit layer of the touch keyboard, so as to be advantageous to the thinning design of the touch keyboard.

Figure 4:
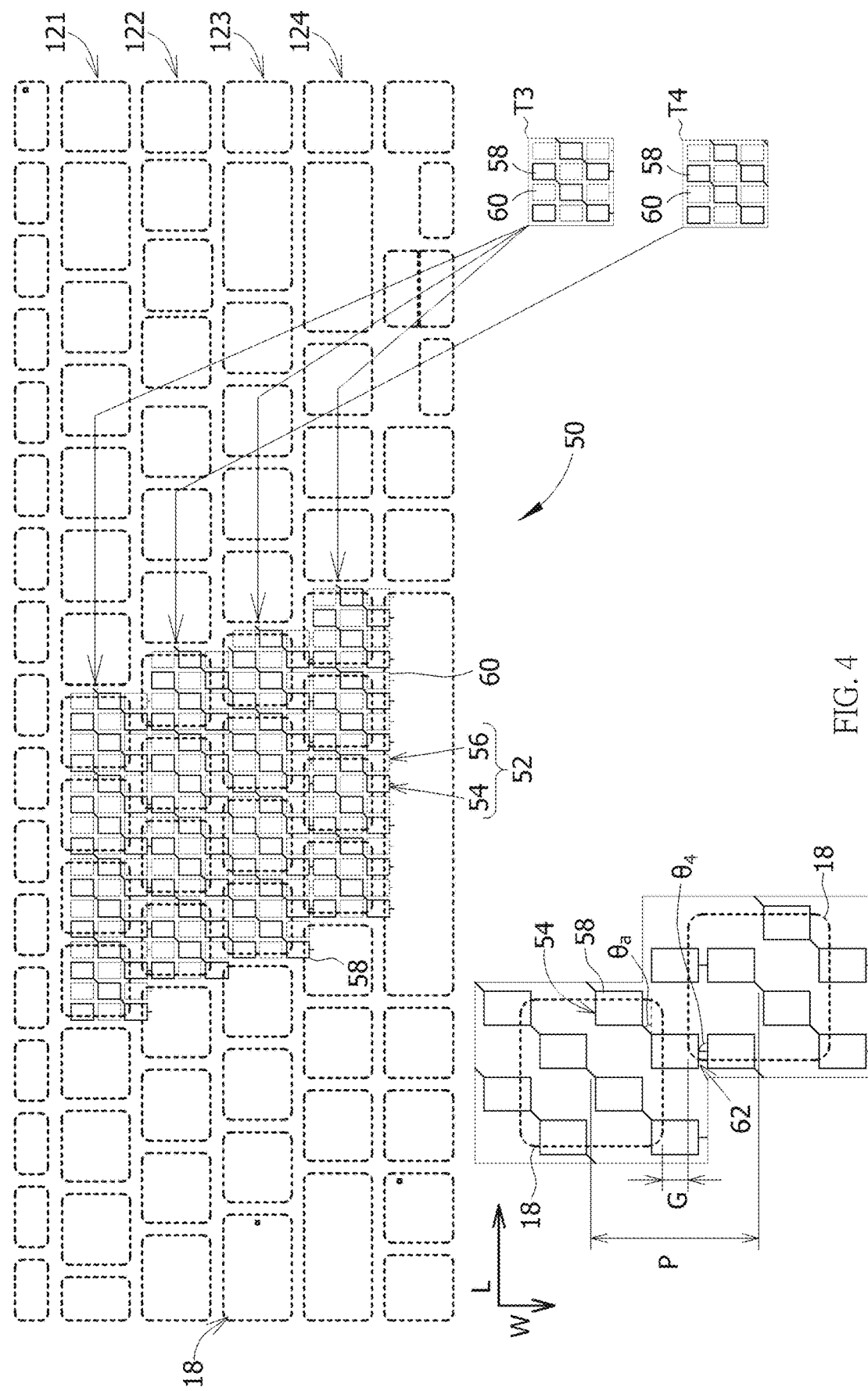
FIG. 4 is a diagram of a touch keyboard according to a second embodiment of the present invention.

In the second embodiment, the present invention adopts the electrode arrangement design in which each keyswitch 12 corresponds to a 4*3 electrode matrix. For example, please refer to FIG. 4, which is a diagram of a touch keyboard 50 according to the second embodiment of the present invention. Components both mentioned in this embodiment and the aforesaid embodiment represent components with similar structures or functions, and the related description is omitted herein. In this embodiment, the touch keyboard 50 includes the plurality of keyswitches 12 and a keyboard touch electrode module 52. As shown in FIG. 4, the keyboard touch electrode module 52 includes a plurality of first electrode rows 54 and a plurality of second electrode rows 56. Each first electrode row 54 has a plurality of first electrodes 58 (preferably in a rectangle shape) electrically connected to each other in series. Each second electrode row 56 has a plurality of second electrodes 60 (preferably in a rectangle shape) electrically connected to each other in series. As shown in FIG. 4, in each key projection area 18, two adjacent first electrodes 58 and two adjacent second electrodes 60 are arranged alternately and symmetrically relative to the center of the key projection area 18. Furthermore, as shown in the lower left portion of FIG. 4 (for clearly showing the electrode arrangement angle of the first electrode row 54, the second electrode rows 56 are omitted in FIG. 4), each first electrode row 54 is an oblique electrode row arranged at the first primary angle $\theta_3$ (i.e. the oblique electrode connection). Each first electrode row 54 further includes at least one first shift section 62 arranged at a first secondary angle $\theta_4$ (i.e. the straight electrode connection). To be noted, the aforesaid electrode arrangement design of the first electrode row 54 could be applied to the second electrode row 56, and the related description could be reasoned by analogy according to the aforesaid description and FIG. 4 and omitted herein.

In brief, the present invention can define the sizes of the first electrode 58 and the second electrode 60 according to the aforesaid equation, so that the first electrode rows 54 and the second electrode rows 56 on the keyboard touch electrode module 52 can jointly form an electrode arrangement in which each keyswitch 12 corresponds to six first electrodes 58 and six second electrodes 60 and these electrodes can form a 4*3 electrode matrix. The first electrode row 54 includes six first electrodes 58 continuously arranged at the first primary angle $\theta_3$ (i.e. the oblique electrode connection). The first electrode row 54 further includes a seventh first electrode 58 arranged after the six first electrodes 58 at the first secondary angle $\theta_4$ (i.e. the straight electrode connection) to form the first shift section 62 of the first electrode row 54. As shown in a lower right portion of FIG. 4, the 4*3 electrode matrix corresponding to each keyswitch 12 is arranged according to a primary matrix layout T3 or a secondary matrix layout T4.

In other words, as shown in FIG. 4, the plurality of first electrode rows 54 and the plurality of second electrode rows 56 can form a plurality of primary matrix layouts T3 corresponding to the first keyswitch row 121, the third keyswitch row 123, and the fourth keyswitch row 124, and can form a plurality of secondary matrix layouts T4 corresponding to the second keyswitch layout 122. A center connection angle of the two adjacent first electrodes 58 located between the primary matrix layout T3 (corresponding to the first keyswitch row 121) and the secondary matrix layout T4 (corresponding to the second keyswitch row 122) is different from a center connection angle of the two adjacent first electrodes 58 in the primary matrix layout T3. A center connection angle of the two adjacent first electrodes 58 located between the primary matrix layout T3 (corresponding to the third keyswitch row 123) and the primary matrix layout T3 (corresponding to the fourth keyswitch row 124) is different from the center connection angle of the two adjacent first electrodes 58 in the primary matrix layout T3. As for the other designs (e.g. the triggering design of the keyboard touch electrode module 52) of the touch keyboard 50, the related description could be reasoned by analogy according to the first embodiment and omitted herein.

Figure 5:
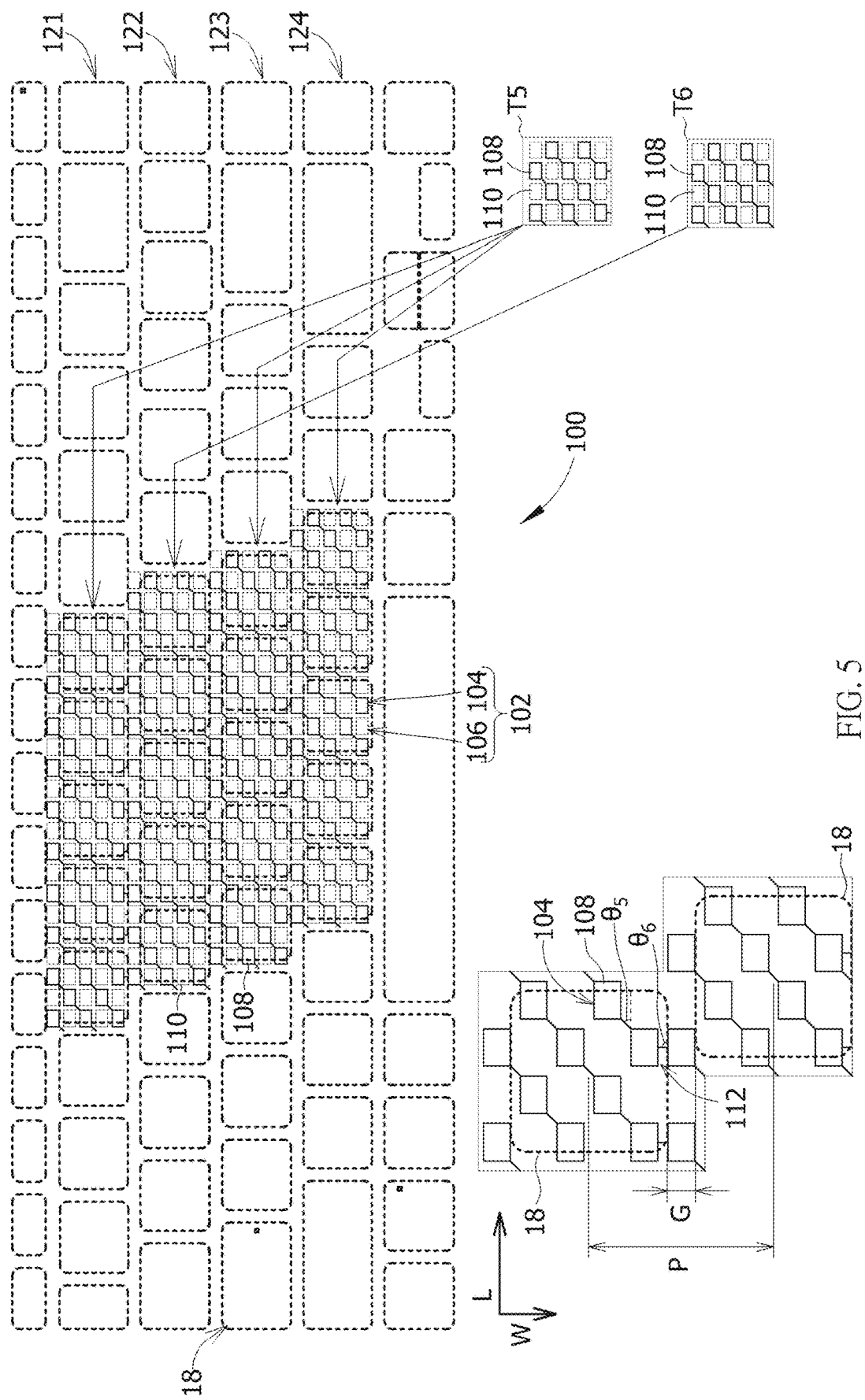
FIG. 5 is a diagram of a touch keyboard according to a third embodiment of the present invention.

In the third embodiment, the present invention adopts the electrode arrangement design in which each keyswitch 12 corresponds to a 4*5 electrode matrix. For example, please refer to FIG. 5, which is a diagram of a touch keyboard 100 according to the third embodiment of the present invention. In this embodiment, the touch keyboard 100 includes the plurality of keyswitches 12 and a keyboard touch electrode module 102. As shown in FIG. 5, the keyboard touch electrode module 102 includes a plurality of first electrode rows 104 and a plurality of second electrode rows 106. Each first electrode row 104 has a plurality of first electrodes 108 (preferably in a rectangle shape) electrically connected to each other in series. Each second electrode row 106 has a plurality of second electrodes 110 (preferably in a rectangle shape) electrically connected to each other in series. As shown in FIG. 5, in each key projection area 18, two adjacent first electrodes 108 and two adjacent second electrodes 110 are arranged alternately and symmetrically relative to the center of each key projection area 18. Furthermore, as shown in the lower left portion of FIG. 5 (for clearly showing the electrode arrangement angle of the first electrode row 104, the second electrode rows 106 are omitted in FIG. 5), each first electrode row 104 is an oblique electrode row arranged at the first primary angle $\theta_s$ (i.e. the oblique electrode connection). Each first electrode row 104 further includes at least one first shift section 112 arranged at a first secondary angle $\theta_6$. To be noted, the aforesaid electrode arrangement design of the first electrode row 104 could be applied to the second electrode row 106, and the related description could be reasoned by analogy according to the aforesaid description and FIG. 5 and omitted herein.

In brief, the present invention can define the sizes of the first electrode 108 and the second electrode 110 according to the aforesaid equation, so that the first electrode rows 104 and the second electrode rows 106 on the keyboard touch electrode module 102 can jointly form an electrode arrangement in which each keyswitch 12 corresponds to ten first electrodes 108 and ten second electrodes 110 and these electrodes can form a 4*5 electrode matrix. The first electrode row 104 includes ten first electrodes 108 continuously arranged at the first primary angle $\theta_s$. The first electrode row 104 further includes an eleventh first electrode 108 arranged after the ten first electrodes 108 at the first secondary angle $\theta_6$ to form the first shift section 112 of the first electrode row 104. As shown in a lower right portion of FIG. 5, the 4*5 electrode matrix corresponding to each keyswitch 12 is arranged according to a primary matrix layout T5 or a secondary matrix layout T6.

In other words, as shown in FIG. 5, the plurality of first electrode rows 104 and the plurality of second electrode rows 106 can form a plurality of primary matrix layouts T5 corresponding to the first keyswitch row 121, the third keyswitch row 123, and the fourth keyswitch row 124, and can form a plurality of secondary matrix layouts T6 corresponding to the second keyswitch layout 122. A center connection angle of the two adjacent first electrodes 108 located between the primary matrix layout T5 (corresponding to the first keyswitch row 121) and the secondary matrix layout T6 (corresponding to the second keyswitch row 122) is different from a center connection angle of the two adjacent first electrodes 108 in the primary matrix layout T5. A center connection angle of the two adjacent first electrodes 108 located between the primary matrix layout T5 (corresponding to the third keyswitch row 123) and the primary matrix layout T5 (corresponding to the fourth keyswitch row 124) is different from the center connection angle of the two adjacent first electrodes 108 in the primary matrix layout T5. As for the other designs (e.g. the triggering design of the keyboard touch electrode module 102) of the touch keyboard 100, the related description could be reasoned by analogy according to the first embodiment and omitted herein.

Figure 6:
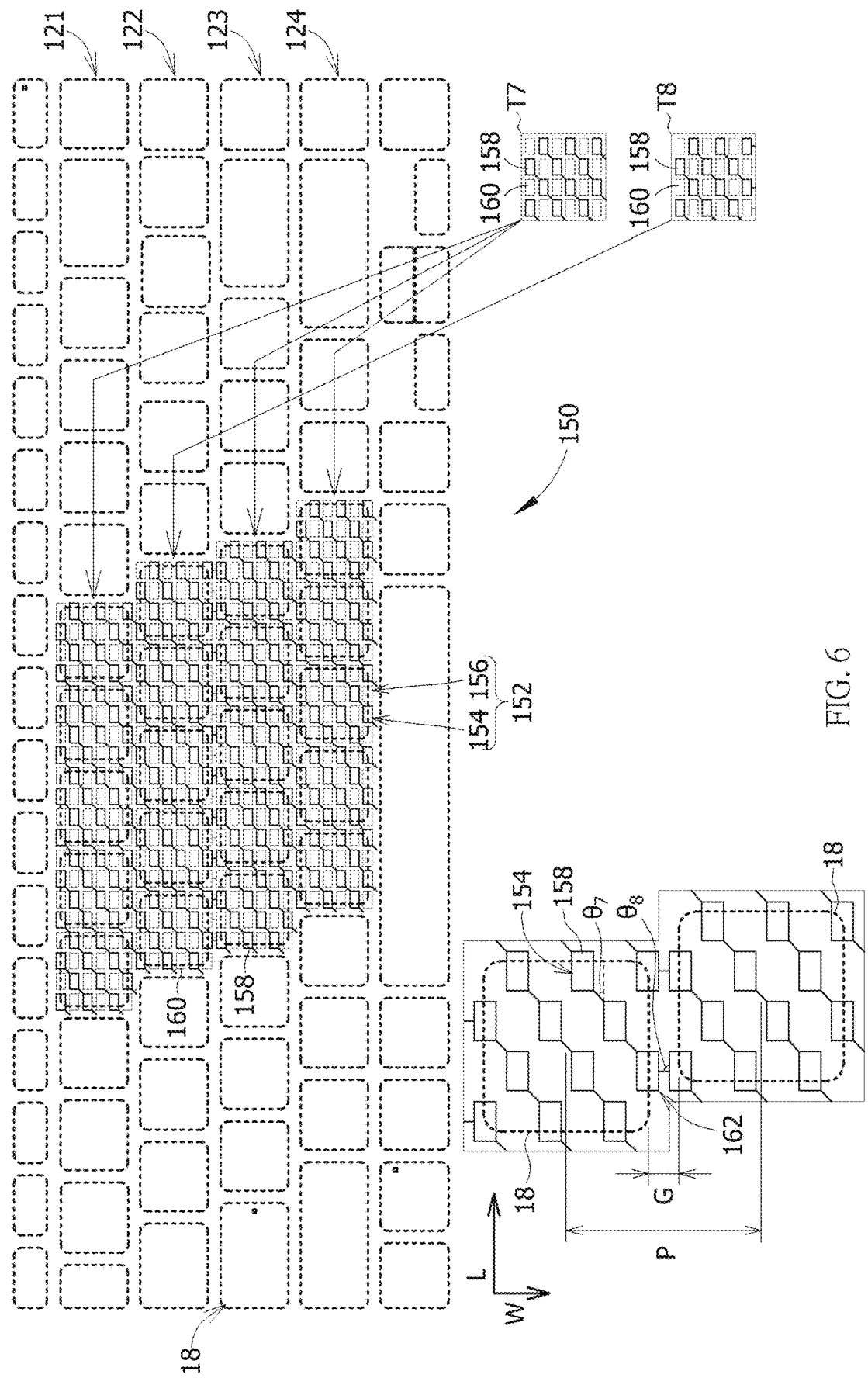
FIG. 6 is a diagram of a touch keyboard according to a fourth embodiment of the present invention.

In the fourth embodiment, the present invention adopts the electrode arrangement design in which each keyswitch 12 corresponds to a 4*6 electrode matrix. For example, please refer to FIG. 6, which is a diagram of a touch keyboard 150 according to the fourth embodiment of the present invention. In this embodiment, the touch keyboard 150 includes the plurality of keyswitches 12 and a keyboard touch electrode module 152. As shown in FIG. 6, the keyboard touch electrode module 152 includes a plurality of first electrode rows 154 and a plurality of second electrode rows 156. Each first electrode row 154 has a plurality of first electrodes 158 (preferably in a rectangle shape) electrically connected to each other in series. Each second electrode row 156 has a plurality of second electrodes 160 (preferably in a rectangle shape) electrically connected to each other in series. As shown in FIG. 6, in each key projection area 18, two adjacent first electrodes 158 and two adjacent second electrodes 160 are arranged alternately and symmetrically relative to the center of each key projection area 18. Furthermore, as shown in the lower left portion of FIG. 6 (for clearly showing the electrode arrangement angle of the first electrode row 154, the second electrode rows 156 are omitted in FIG. 6), each first electrode row 154 is an oblique electrode row arranged at the first primary angle $\theta_7$ (i.e. the oblique electrode connection). Each first electrode row 154 further includes at least one first shift section 162 arranged at a first secondary angle $\theta_8$. To be noted, the aforesaid electrode arrangement design of the first electrode row 154 could be applied to the second electrode row 156, and the related description could be reasoned by analogy according to the aforesaid description and FIG. 6 and omitted herein.

In brief, the present invention can define the sizes of the first electrode 158 and the second electrode 160 according to the aforesaid equation, so that the first electrode rows 154 and the second electrode rows 156 on the keyboard touch electrode module 152 can jointly form an electrode arrangement in which each keyswitch 12 corresponds to twelve first electrodes 158 and twelve second electrodes 160 and these electrodes can form a 4*6 electrode matrix. The first electrode row 154 includes twelve first electrodes 158 continuously arranged at the first primary angle $\theta_7$. The first electrode row 154 further includes a thirteenth first electrode 158 arranged after the twelve first electrodes 158 at the first secondary angle $\theta_8$ to form the first shift section 162. As shown in a lower right portion of FIG. 6, the 4*6 electrode matrix corresponding to each keyswitch 12 is arranged according to a primary matrix layout T7 or a secondary matrix layout T8.

In other words, as shown in FIG. 6, the plurality of first electrode rows 154 and the plurality of second electrode rows 156 can form a plurality of primary matrix layouts T7 corresponding to the first keyswitch row 121, the third keyswitch row 123, and the fourth keyswitch row 124, and can form a plurality of secondary matrix layouts T8 corresponding to the second keyswitch layout 122. A center connection angle of the two adjacent first electrodes 158 located between the secondary matrix layout T8 (corresponding to the second keyswitch row 122) and the primary matrix layout T7 (corresponding to the third keyswitch row 123) is different from a center connection angle of the two adjacent first electrodes 158 in the primary matrix layout T7. As for the other designs (e.g. the triggering design of the keyboard touch electrode module 152) of the touch keyboard 150, the related description could be reasoned by analogy according to the first embodiment and omitted herein.

Figure 7:
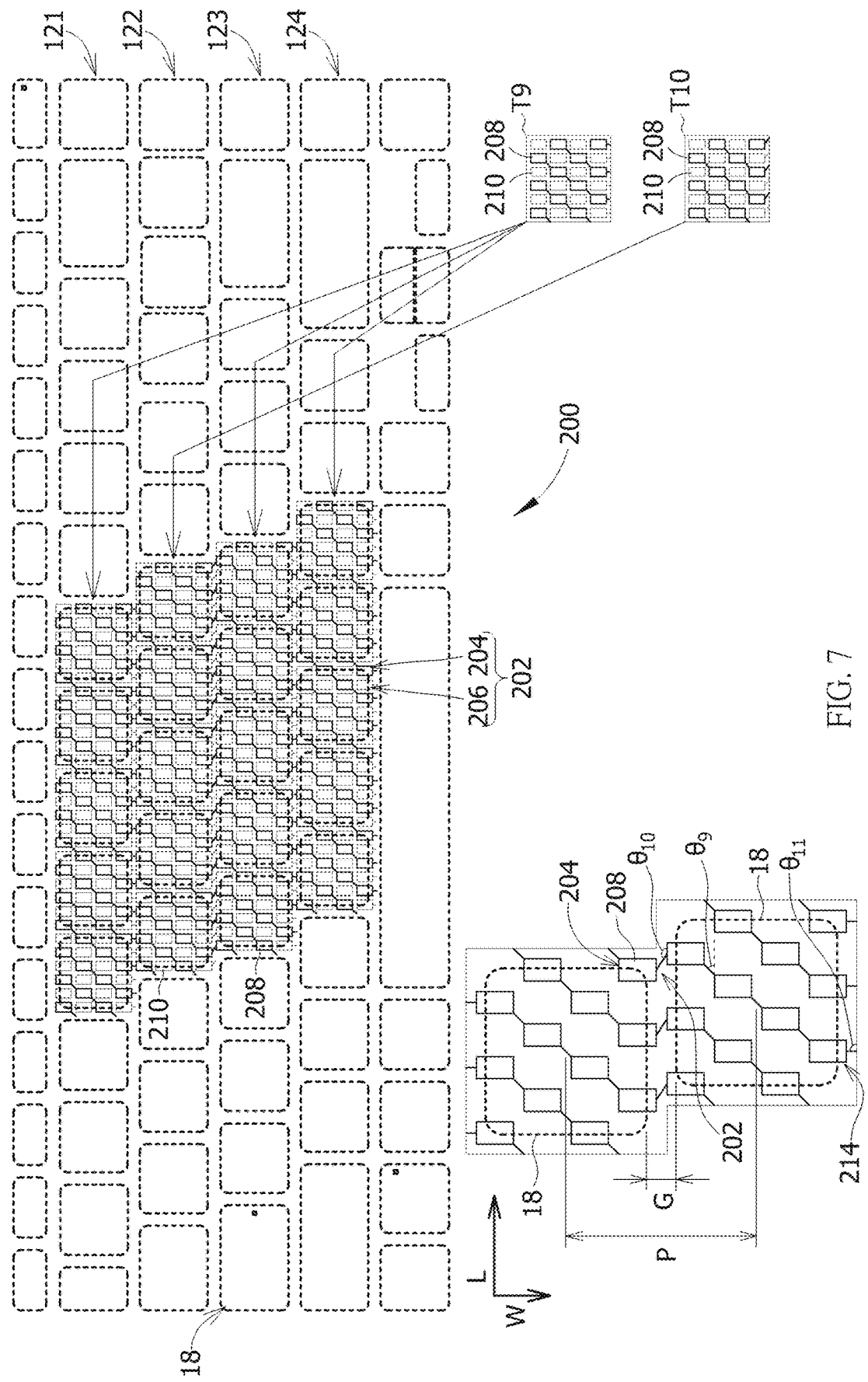
FIG. 7 is a diagram of a touch keyboard according to a fifth embodiment of the present invention.

In the fifth embodiment, the present invention adopts the electrode arrangement design in which each keyswitch 12 corresponds to a 6*4 electrode matrix. For example, please refer to FIG. 7, which is a diagram of a touch keyboard 200 according to the fifth embodiment of the present invention. In this embodiment, the touch keyboard 200 includes the plurality of keyswitches 12 and a keyboard touch electrode module 202. As shown in FIG. 7, the keyboard touch electrode module 202 includes a plurality of first electrode rows 204 and a plurality of second electrode rows 206. Each first electrode row 204 has a plurality of first electrodes 208 (preferably in a rectangle shape) electrically connected to each other in series. Each second electrode row 206 has a plurality of second electrodes 210 (preferably in a rectangle shape) electrically connected to each other in series. As shown in FIG. 7, in each key projection area 18, two adjacent first electrodes 208 and two adjacent second electrodes 210 are arranged alternately and symmetrically relative to the center of each key projection area 18. Furthermore, as shown in the lower left portion of FIG. 7 (for clearly showing the electrode arrangement angle of the first electrode row 204, the second electrode rows 206 are omitted in FIG. 7), each first electrode row 204 is an oblique electrode row arranged at the first primary angle $\theta_9$ (i.e. the oblique electrode connection). Each first electrode row 204 further includes at least one first displacement section 212 (i.e. the oblique electrode connection) arranged at a displacement angle $\theta_{10}$ and at least one first shift section 214 arranged at a first secondary angle $\theta_{11}$. To be noted, the aforesaid electrode arrangement design of the first electrode row 204 could be applied to the second electrode row 206, and the related description could be reasoned by analogy according to the aforesaid description and FIG. 7 and omitted herein.

In brief, the present invention can define the sizes of the first electrode 208 and the second electrode 210 according to the aforesaid equation, so that the first electrode rows 204 and the second electrode rows 206 on the keyboard touch electrode module 202 can jointly form an electrode arrangement in which each keyswitch 12 corresponds to twelve first electrodes 208 and twelve second electrodes 210 and these electrodes can form a 6*4 electrode matrix. The first electrode row 204 includes four first electrodes 208 continuously arranged at the first primary angle $\theta_9$. A first electrode 208 before the four first electrodes 208 is arranged at the displacement angle $\theta_{10}$, and a first electrode 208 after the four first electrodes 208 is arranged at the first secondary angle $\theta_{11}$. As shown in a lower right portion of FIG. 7, the 6*4 electrode matrix corresponding to each keyswitch 12 is arranged according to a primary matrix layout T9 or a secondary matrix layout T10.

In other words, as shown in FIG. 7, the plurality of first electrode rows 204 and the plurality of second electrode rows 206 can form a plurality of primary matrix layouts T9 corresponding to the first keyswitch row 121, the third keyswitch row 123, and the fourth keyswitch row 124, and can form a plurality of secondary matrix layouts T10 corresponding to the second keyswitch layout 122. A center connection angle of the two adjacent first electrodes 208 located between the primary matrix layout T9 (corresponding to the first keyswitch row 121) and the secondary matrix layout T10 (corresponding to the second keyswitch row 122) is different from a center connection angle of the two adjacent first electrodes 208 in the primary matrix layout T9. A center connection angle of the two adjacent first electrodes 208 located between the secondary matrix layout T10 (corresponding to the second keyswitch row 122) and the primary matrix layout T9 (corresponding to the third keyswitch row 123) is different from the center connection angle of the two adjacent first electrodes 208 in the primary matrix layout T10. A center connection angle of the two adjacent first electrodes 208 located between the primary matrix layout T9 (corresponding to the third keyswitch row 123) and the primary matrix layout T9 (corresponding to the fourth keyswitch row 124) is different from the center connection angle of the two adjacent first electrodes 208 in the primary matrix layout T9. As for the other designs (e.g. the triggering design of the keyboard touch electrode module 202) of the touch keyboard 200, the related description could be reasoned by analogy according to the first embodiment and omitted herein.

Figure 8:
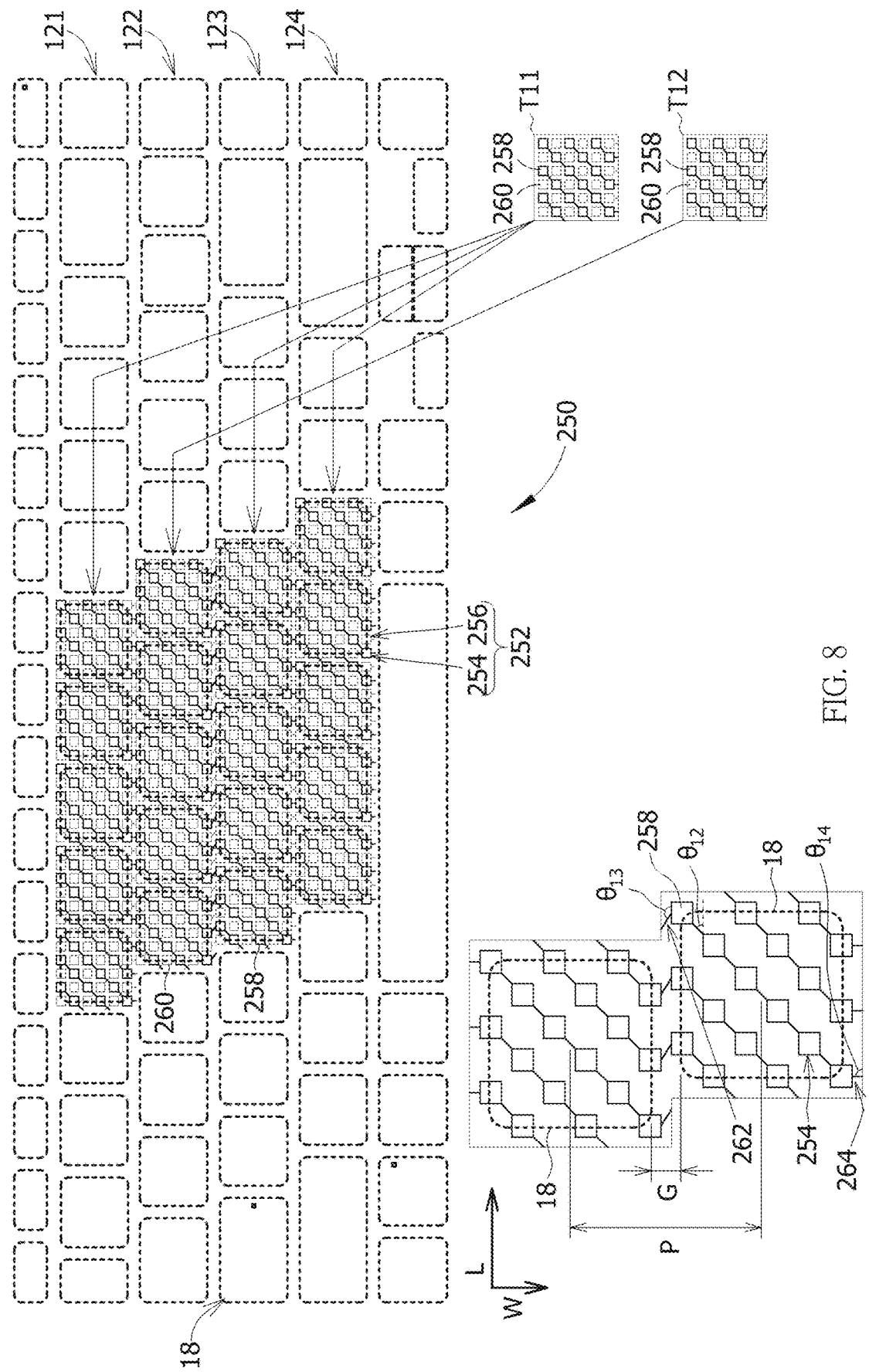
FIG. 8 is a diagram of a touch keyboard according to a sixth embodiment of the present invention.

In the sixth embodiment, the present invention adopts the electrode arrangement design in which each keyswitch 12 corresponds to a 6*6 electrode matrix. For example, please refer to FIG. 8, which is a diagram of a touch keyboard 250 according to the sixth embodiment of the present invention. In this embodiment, the touch keyboard 250 includes the plurality of keyswitches 12 and a keyboard touch electrode module 252. As shown in FIG. 8, the keyboard touch electrode module 252 includes a plurality of first electrode rows 254 and a plurality of second electrode rows 256. Each first electrode row 254 has a plurality of first electrodes 258 (preferably in a rectangle shape) electrically connected to each other in series. Each second electrode row 256 has a plurality of second electrodes 260 (preferably in a rectangle shape) electrically connected to each other in series. As shown in FIG. 8, in each key projection area 18, two adjacent first electrodes 258 and two adjacent second electrodes 260 are arranged alternately and symmetrically relative to the center of each key projection area 18. Furthermore, as shown in the lower left portion of FIG. 8 (for clearly showing the electrode arrangement angle of the first electrode row 254, the second electrode rows 256 are omitted in FIG. 8), each first electrode row 254 is an oblique electrode row arranged at the first primary angle $\theta_{12}$ (i.e. the oblique electrode connection). Each first electrode row 254 further includes at least one first displacement section 262 (i.e. the oblique electrode connection) arranged at a displacement angle $\theta_{13}$ and at least one first shift section 264 arranged at a first secondary angle $\theta_{14}$. To be noted, the aforesaid electrode arrangement design of the first electrode row 254 could be applied to the second electrode row 256, and the related description could be reasoned by analogy according to the aforesaid description and FIG. 8 and omitted herein.

In brief, the present invention can define the sizes of the first electrode 258 and the second electrode 260 according to the aforesaid equation, so that the first electrode rows 254 and the second electrode rows 256 on the keyboard touch electrode module 252 can jointly form an electrode arrangement in which each keyswitch 12 corresponds to eighteen first electrodes 258 and eighteen second electrodes 260 and these electrodes can form a 6*6 electrode matrix. The first electrode row 254 includes six first electrodes 258 continuously arranged at the first primary angle $\theta_{12}$. A first electrode 258 before the six first electrodes 258 is arranged at the displacement angle $\theta_{13}$, and a first electrode 258 after the six first electrodes 258 is arranged at the first secondary angle $\theta_{14}$. As shown in a lower right portion of FIG. 8, the 6*6 electrode matrix corresponding to each keyswitch 12 is arranged according to a primary matrix layout T11 or a secondary matrix layout T12.

In other words, as shown in FIG. 8, the plurality of first electrode rows 254 and the plurality of second electrode rows 256 can form a plurality of primary matrix layouts T11 corresponding to the first keyswitch row 121, the third keyswitch row 123, and the fourth keyswitch row 124, and can form a plurality of secondary matrix layouts T12 corresponding to the second keyswitch layout 122. A center connection angle of the two adjacent first electrodes 258 located between the primary matrix layout T11 (corresponding to the first keyswitch row 121) and the secondary matrix layout T12 (corresponding to the second keyswitch row 122) is different from a center connection angle of the two adjacent first electrodes 258 in the primary matrix layout T11. A center connection angle of the two adjacent first electrodes 258 located between the secondary matrix layout T12 (corresponding to the second keyswitch row 122) and the primary matrix layout T11 (corresponding to the third keyswitch row 123) is different from the center connection angle of the two adjacent first electrodes 258 in the primary matrix layout T11. A center connection angle of the two adjacent first electrodes 258 located between the primary matrix layout T11 (corresponding to the third keyswitch row 123) and the primary matrix layout T11 (corresponding to the fourth keyswitch row 124) is different from the center connection angle of the two adjacent first electrodes 258 in the primary matrix layout T11. As for the other designs (e.g. the triggering design of the keyboard touch electrode module 252) of the touch keyboard 250, the related description could be reasoned by analogy according to the first embodiment and omitted herein.

Figure 9:
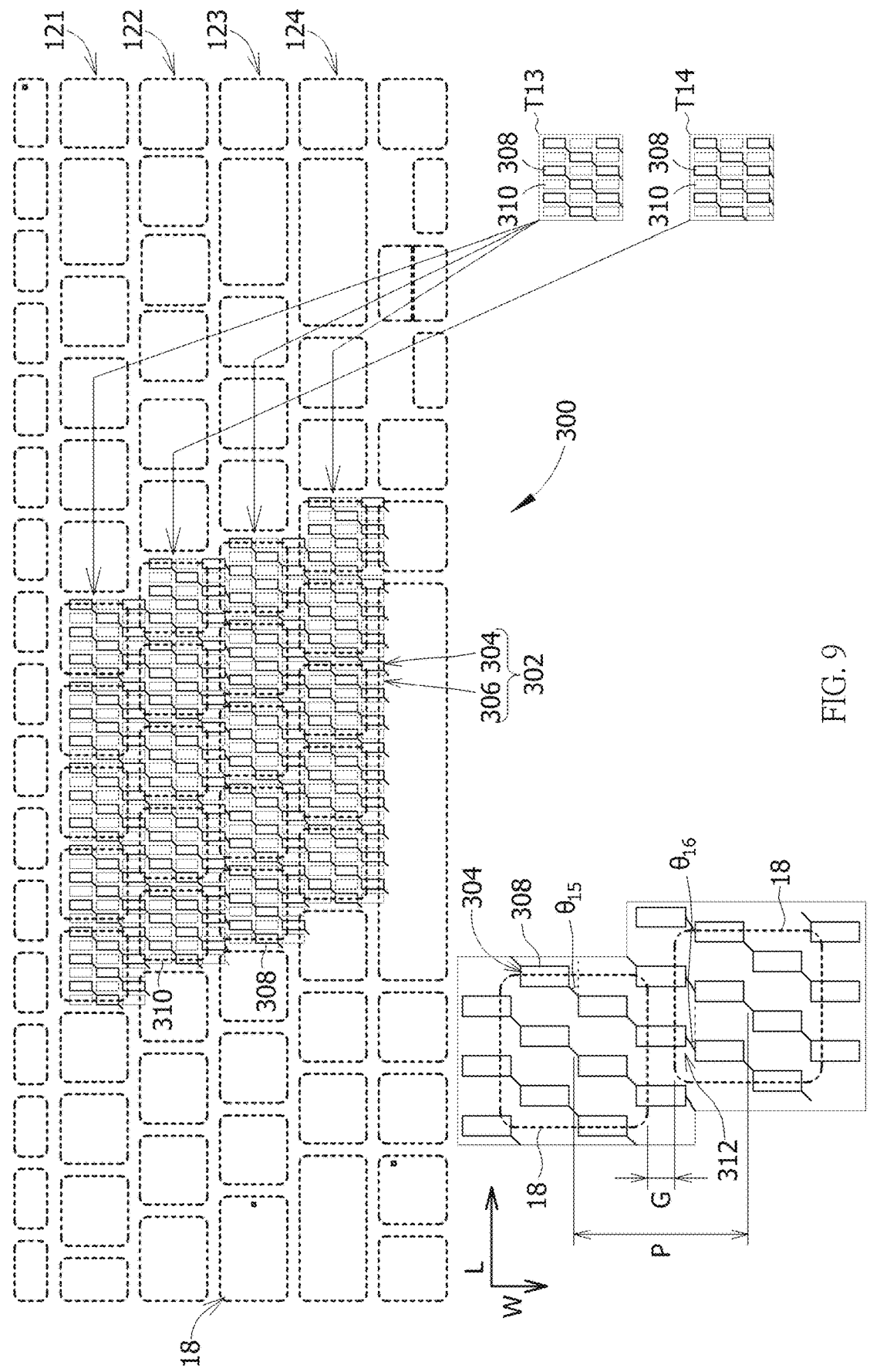
FIG. 9 is a diagram of a touch keyboard according to a seventh embodiment of the present invention.

In the seventh embodiment, the present invention adopts the electrode arrangement design in which each keyswitch 12 corresponds to a 6*3 electrode matrix. For example, please refer to FIG. 9, which is a diagram of a touch keyboard 300 according to the seventh embodiment of the present invention. In this embodiment, the touch keyboard 300 includes the plurality of keyswitches 12 and a keyboard touch electrode module 302. As shown in FIG. 9, the keyboard touch electrode module 302 includes a plurality of first electrode rows 304 and a plurality of second electrode rows 306. Each first electrode row 304 has a plurality of first electrodes 308 (preferably in a rectangle shape) electrically connected to each other in series. Each second electrode row 306 has a plurality of second electrodes 310 (preferably in a rectangle shape) electrically connected to each other in series. As shown in FIG. 9, in each key projection area 18, two adjacent first electrodes 308 and two adjacent second electrodes 310 are arranged alternately and symmetrically relative to the center of each key projection area 18. Furthermore, as shown in the lower left portion of FIG. 9 (for clearly showing the electrode arrangement angle of the first electrode row 304, the second electrode rows 306 are omitted in FIG. 9), each first electrode row 304 is an oblique electrode row arranged at the first primary angle $\theta_{15}$ (i.e. the oblique electrode connection). Each first electrode row 304 further includes at least one first shift section 312 (i.e. the oblique electrode connection) arranged at a first secondary angle $\theta_{15}$. To be noted, the aforesaid electrode arrangement design of the first electrode row 304 could be applied to the second electrode row 306, and the related description could be reasoned by analogy according to the aforesaid description and FIG. 9 and omitted herein.

In brief, the present invention can define the sizes of the first electrode 308 and the second electrode 310 according to the aforesaid equation, so that the first electrode rows 304 and the second electrode rows 306 on the keyboard touch electrode module 302 can jointly form an electrode arrangement in which each keyswitch 12 corresponds to nine first electrodes 308 and nine second electrodes 310 and these electrodes can form a 6*3 electrode matrix. As shown in a lower right portion of FIG. 9, the 6*3 electrode matrix corresponding to each keyswitch 12 is arranged according to a primary matrix layout T13 or a secondary matrix layout T14.

In other words, as shown in FIG. 9, the plurality of first electrode rows 304 and the plurality of second electrode rows 306 can form a plurality of primary matrix layouts T13 corresponding to the first keyswitch row 121, the third keyswitch row 123, and the fourth keyswitch row 124, and can form a plurality of secondary matrix layouts T14 corresponding to the second keyswitch row 122. A center connection angle of the two adjacent first electrodes 308 located between the secondary matrix layout T14 (corresponding to the second keyswitch row 122) and the primary matrix layout T13 (corresponding to the third keyswitch row 123) is different from a center connection angle of the two adjacent first electrodes 308 in the primary matrix layout T13. As for the other designs (e.g. the triggering design of the keyboard touch electrode module 302) of the touch keyboard 300, the related description could be reasoned by analogy according to the first embodiment and omitted herein.

Figure 10:
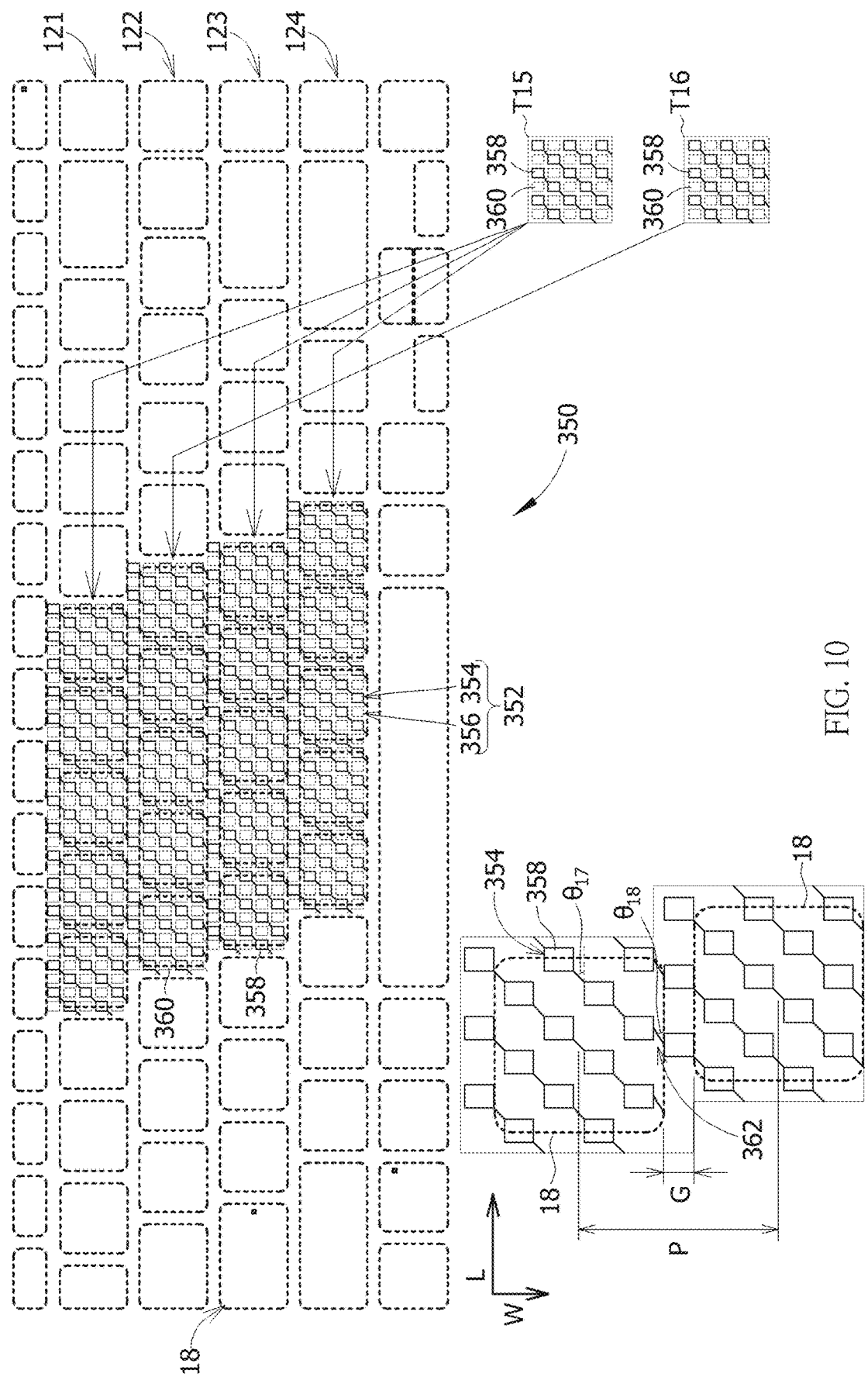
FIG. 10 is a diagram of a touch keyboard according to an eighth embodiment of the present invention.

In the eighth embodiment, the present invention adopts the electrode arrangement design in which each keyswitch 12 corresponds to a 6*5 electrode matrix. For example, please refer to FIG. 10, which is a diagram of a touch keyboard 350 according to the eighth embodiment of the present invention. In this embodiment, the touch keyboard 350 includes the plurality of keyswitches 12 and a keyboard touch electrode module 352. As shown in FIG. 10, the keyboard touch electrode module 352 includes a plurality of first electrode rows 354 and a plurality of second electrode rows 356. Each first electrode row 354 has a plurality of first electrodes 358 (preferably in a rectangle shape) electrically connected to each other in series. Each second electrode row 356 has a plurality of second electrodes 360 (preferably in a rectangle shape) electrically connected to each other in series. As shown in FIG. 10, in each key projection area 18, two adjacent first electrodes 358 and two adjacent second electrodes 360 are arranged alternately and symmetrically relative to the center of each key projection area 18. Furthermore, as shown in the lower left portion of FIG. 10 (for clearly showing the electrode arrangement angle of the first electrode row 354, the second electrode rows 356 are omitted in FIG. 10), each first electrode row 354 is an oblique electrode row arranged at the first primary angle $\theta_{17}$ (i.e. the oblique electrode connection). Each first electrode row 354 further includes at least one first shift section 362 (i.e. the oblique electrode connection) arranged at a first secondary angle $\theta_{18}$. To be noted, the aforesaid electrode arrangement design of the first electrode row 354 could be applied to the second electrode row 356, and the related description could be reasoned by analogy according to the aforesaid description and FIG. 10 and omitted herein.

In brief, the present invention can define the sizes of the first electrode 358 and the second electrode 360 according to the aforesaid equation, so that the first electrode rows 354 and the second electrode rows 356 on the keyboard touch electrode module 352 can jointly form an electrode arrangement in which each keyswitch 12 corresponds to fifteen first electrodes 358 and fifteen second electrodes 360 and these electrodes can form a 6*5 electrode matrix. As shown in a lower right portion of FIG. 10, the 6*5 electrode matrix corresponding to each keyswitch 12 is arranged according to a primary matrix layout T15 or a secondary matrix layout T16.

In other words, as shown in FIG. 10, the plurality of first electrode rows 354 and the plurality of second electrode rows 356 can form a plurality of primary matrix layouts T15 corresponding to the first keyswitch row 121, the third keyswitch row 123, and the fourth keyswitch row 124, and can form a plurality of secondary matrix layouts T16 corresponding to the second keyswitch row 122. A center connection angle of the two adjacent first electrodes 358 located between the secondary matrix layout T16 (corresponding to the second keyswitch row 122) and the primary matrix layout T15 (corresponding to the third keyswitch row 123) is different from a center connection angle of the two adjacent first electrodes 358 in the primary matrix layout T15. As for the other designs (e.g. the triggering design of the keyboard touch electrode module 352) of the touch keyboard 350, the related description could be reasoned by analogy according to the first embodiment and omitted herein.

Figure 11:
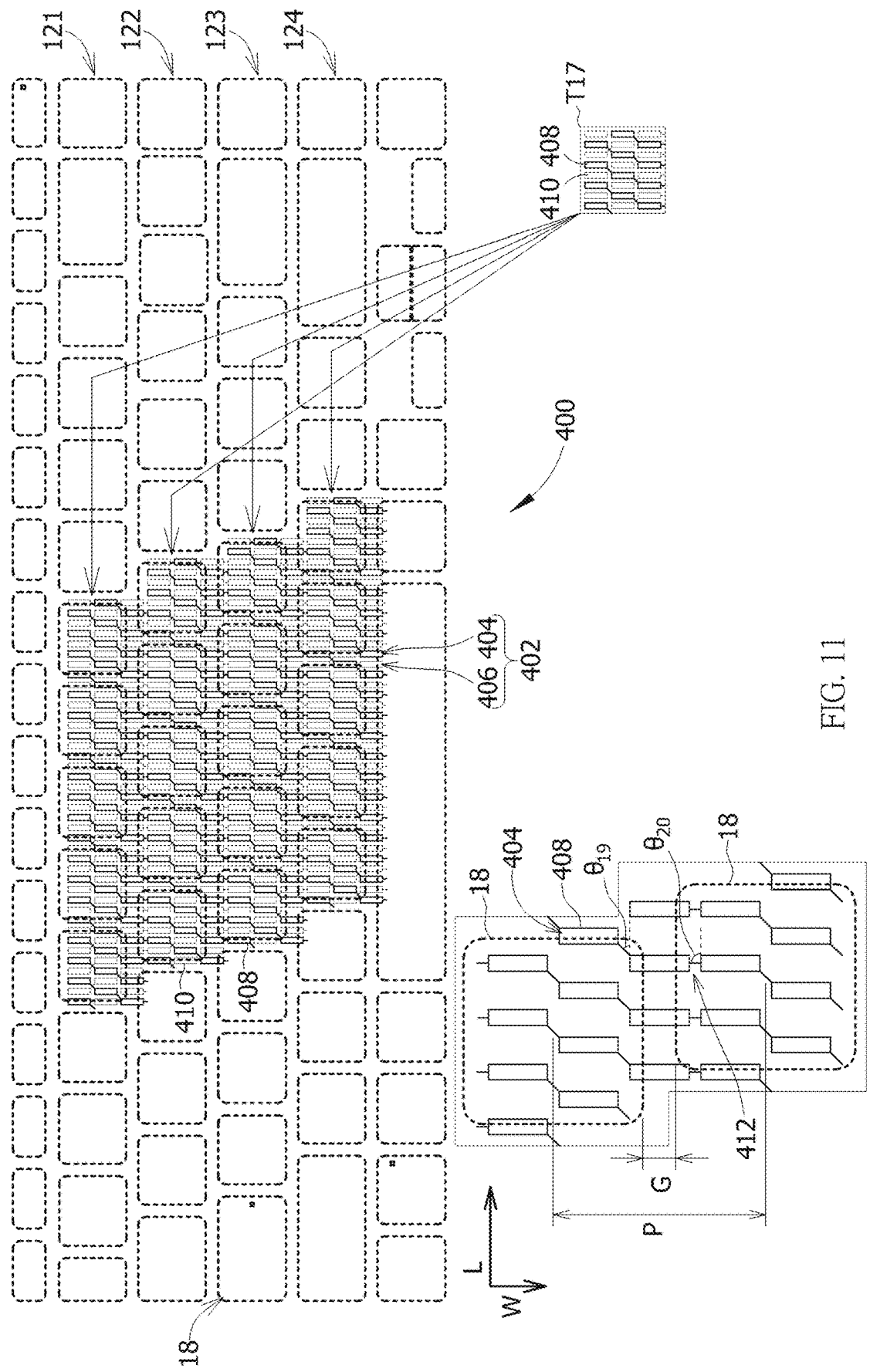
FIG. 11 is a diagram of a touch keyboard according to a ninth embodiment of the present invention.

In the ninth embodiment, the present invention adopts the electrode arrangement design in which each keyswitch 12 corresponds to a 8*3 electrode matrix. For example, please refer to FIG. 11, which is a diagram of a touch keyboard 400 according to the ninth embodiment of the present invention. In this embodiment, the touch keyboard 400 includes the plurality of keyswitches 12 and a keyboard touch electrode module 402. As shown in FIG. 11, the keyboard touch electrode module 402 includes a plurality of first electrode rows 404 and a plurality of second electrode rows 406. Each first electrode row 404 has a plurality of first electrodes 408 (preferably in a rectangle shape) electrically connected to each other in series. Each second electrode row 406 has a plurality of second electrodes 410 (preferably in a rectangle shape) electrically connected to each other in series. As shown in FIG. 11, in each key projection area 18, two adjacent first electrodes 408 and two adjacent second electrodes 410 are arranged alternately and symmetrically relative to the center of each key projection area 18. Furthermore, as shown in the lower left portion of FIG. 11 (for clearly showing the electrode arrangement angle of the first electrode row 404, the second electrode rows 406 are omitted in FIG. 11), each first electrode row 404 is an oblique electrode row arranged at the first primary angle $\theta_{19}$ (i.e. the oblique electrode connection). Each first electrode row 404 further includes at least one first shift section 412 (i.e. the straight electrode connection) arranged at a first secondary angle $\theta_{20}$. To be noted, the aforesaid electrode arrangement design of the first electrode row 404 could be applied to the second electrode row 406, and the related description could be reasoned by analogy according to the aforesaid description and FIG. 11 and omitted herein.

In brief, the present invention can define the sizes of the first electrode 408 and the second electrode 410 according to the aforesaid equation, so that the first electrode rows 404 and the second electrode rows 406 on the keyboard touch electrode module 402 can jointly form an electrode arrangement in which each keyswitch 12 corresponds to twelve first electrodes 408 and twelve second electrodes 410 and these electrodes can form a 8*3 electrode matrix. The first electrode row 404 includes three first electrodes 408 continuously arranged at the first primary angle $\theta_{19}$. The first electrode row 404 further includes a fourth first electrode 408 arranged after the three first electrodes 408 at the first secondary angle $\theta_{20}$ to form the first shift section 412. As shown in a lower right portion of FIG. 11, the 8*3 electrode matrix corresponding to each keyswitch 12 is arranged according to a primary matrix layout T17.

In other words, as shown in FIG. 11, the plurality of first electrode rows 404 and the plurality of second electrode rows 406 can form a plurality of primary matrix layouts T17 corresponding to the first keyswitch row 121, the second keyswitch row 122, the third keyswitch row 123, and the fourth keyswitch row 124. A center connection angle of the two adjacent first electrodes 408 located between the primary matrix layout T17 (corresponding to one of the aforesaid keyswitch rows) and the primary matrix layout T17 (corresponding to the next one of the aforesaid keyswitch rows) is different from a center connection angle of the two adjacent first electrodes 408 in the primary matrix layout T17. As for the other designs (e.g. the triggering design of the keyboard touch electrode module 402) of the touch keyboard 400, the related description could be reasoned by analogy according to the first embodiment and omitted herein.

Figure 12:
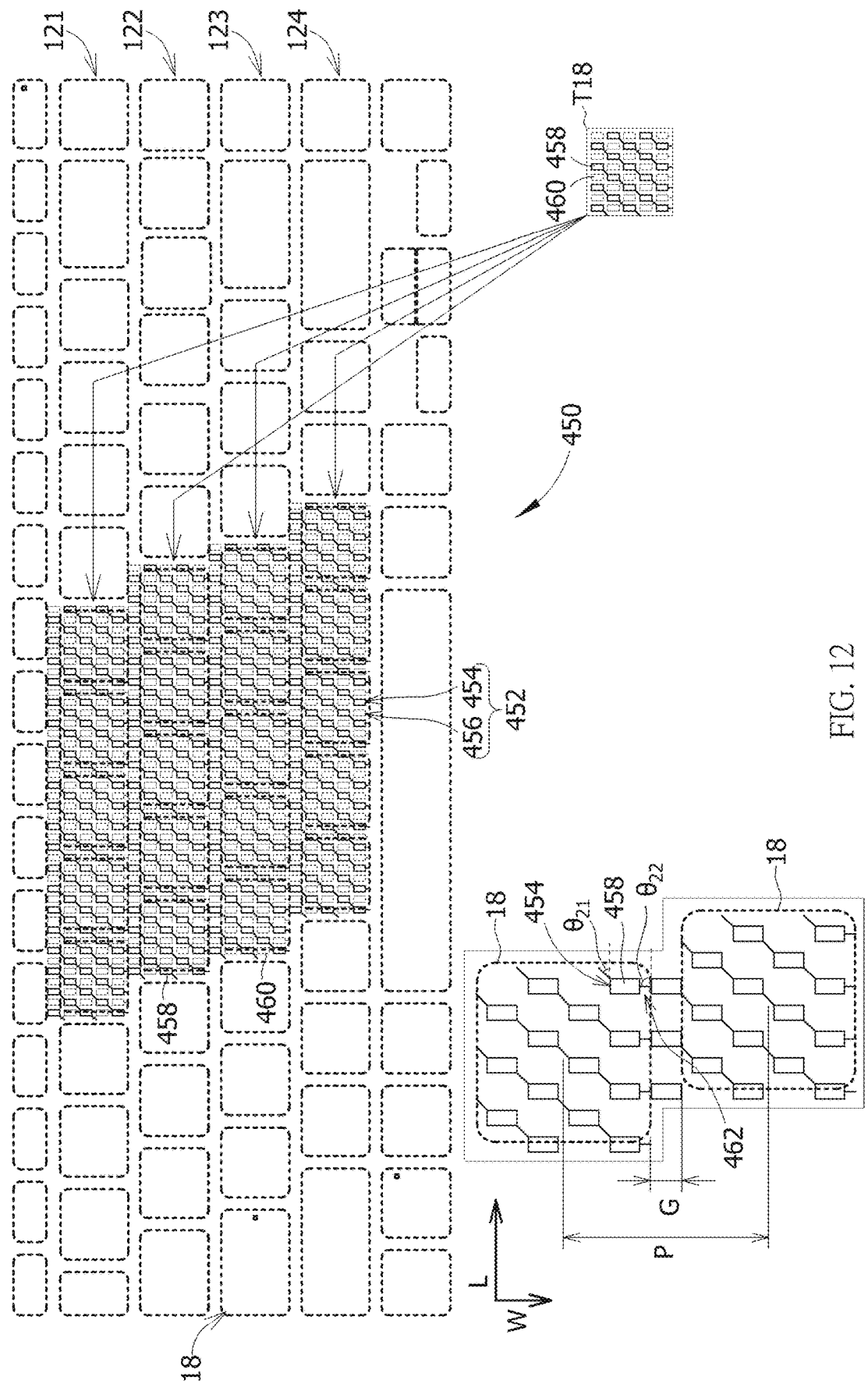
FIG. 12 is a diagram of a touch keyboard according to a tenth embodiment of the present invention.

In the tenth embodiment, the present invention adopts the electrode arrangement design in which each keyswitch 12 corresponds to a 8*5 electrode matrix. For example, please refer to FIG. 12, which is a diagram of a touch keyboard 450 according to the tenth embodiment of the present invention. In this embodiment, the touch keyboard 450 includes the plurality of keyswitches 12 and a keyboard touch electrode module 452. As shown in FIG. 12, the keyboard touch electrode module 452 includes a plurality of first electrode rows 454 and a plurality of second electrode rows 456. Each first electrode row 454 has a plurality of first electrodes 458 (preferably in a rectangle shape) electrically connected to each other in series. Each second electrode row 456 has a plurality of second electrodes 460 (preferably in a rectangle shape) electrically connected to each other in series. As shown in FIG. 12, in each key projection area 18, two adjacent first electrodes 458 and two adjacent second electrodes 460 are arranged alternately and symmetrically relative to the center of each key projection area 18. Furthermore, as shown in the lower left portion of FIG. 12 (for clearly showing the electrode arrangement angle of the first electrode row 454, the second electrode rows 456 are omitted in FIG. 12), each first electrode row 454 is an oblique electrode row arranged at the first primary angle $\theta_{21}$ (i.e. the oblique electrode connection). Each first electrode row 454 further includes at least one first shift section 462 (i.e. the straight electrode connection) arranged at a first secondary angle $\theta_{22}$. To be noted, the aforesaid electrode arrangement design of the first electrode row 454 could be applied to the second electrode row 456, and the related description could be reasoned by analogy according to the aforesaid description and FIG. 12 and omitted herein.

In brief, the present invention can define the sizes of the first electrode 458 and the second electrode 460 according to the aforesaid equation, so that the first electrode rows 454 and the second electrode rows 456 on the keyboard touch electrode module 452 can jointly form an electrode arrangement in which each keyswitch 12 corresponds to twenty first electrodes 458 and twenty second electrodes 460 and these electrodes can form a 8*5 electrode matrix. The first electrode row 454 includes five first electrodes 458 continuously arranged at the first primary angle $\theta_{21}$. The first electrode row 454 further includes a sixth first electrode 458 arranged after the three first electrodes 408 at the first secondary angle $\theta_{22}$ to form the first shift section 462. As shown in a lower right portion of FIG. 12, the 8*5 electrode matrix corresponding to each keyswitch 12 is arranged according to a primary matrix layout T18.

In other words, as shown in FIG. 12, the plurality of first electrode rows 454 and the plurality of second electrode rows 456 can form a plurality of primary matrix layouts T18 corresponding to the first keyswitch row 121, the second keyswitch row 122, the third keyswitch row 123, and the fourth keyswitch row 124. A center connection angle of the two adjacent first electrodes 458 located between the primary matrix layout T18 (corresponding to one of the aforesaid keyswitch rows) and the primary matrix layout T18 (corresponding to the next one of the aforesaid keyswitch rows) is different from a center connection angle of the two adjacent first electrodes 458 in the primary matrix layout T18. As for the other designs (e.g. the triggering design of the keyboard touch electrode module 452) of the touch keyboard 450, the related description could be reasoned by analogy according to the first embodiment and omitted herein.

Figure 13:
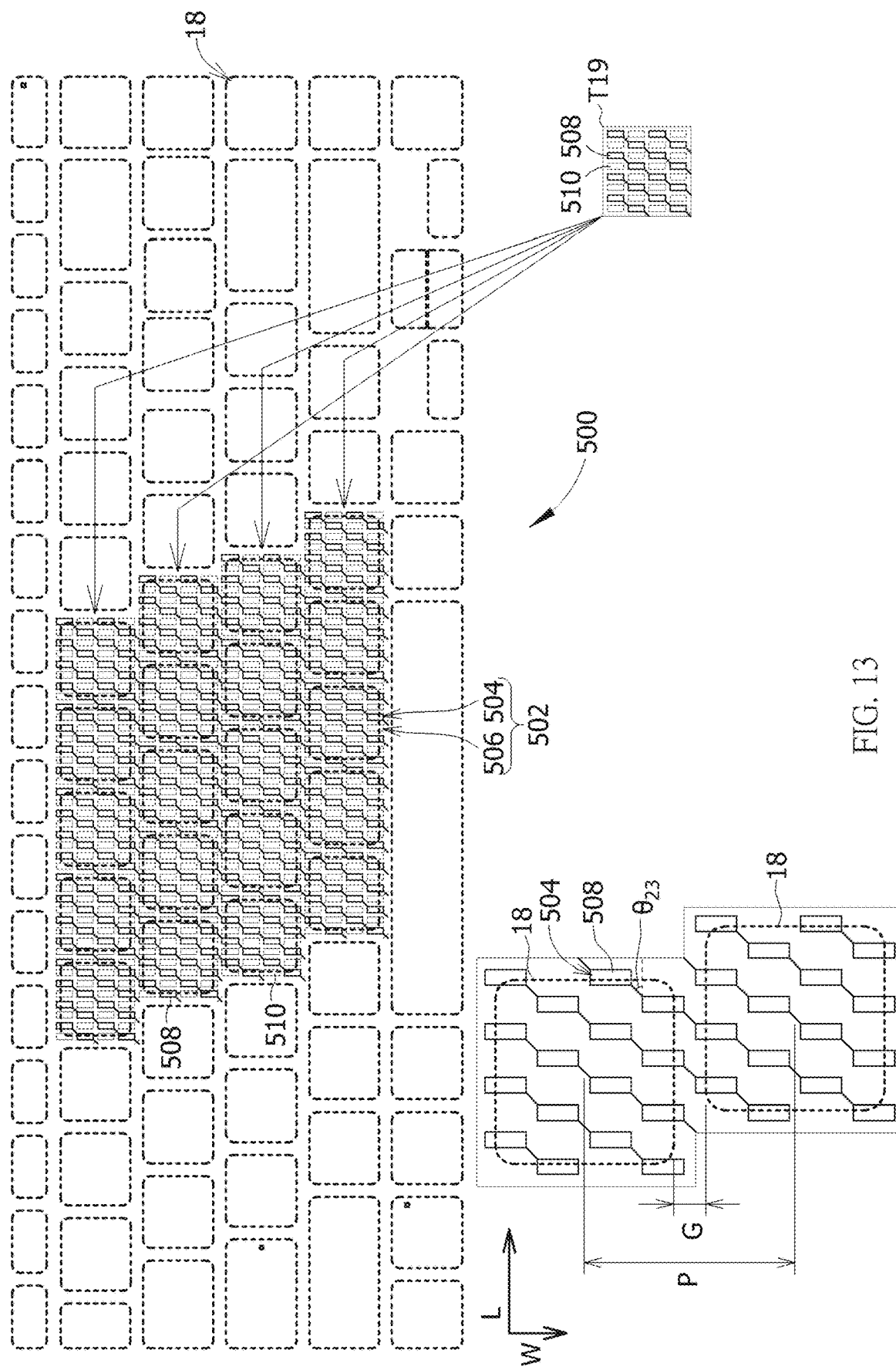
FIG. 13 is a diagram of a touch keyboard according to an eleventh embodiment of the present invention.

In the eleventh embodiment, the present invention adopts the electrode arrangement design in which each keyswitch 12 corresponds to a 8*4 electrode matrix. For example, please refer to FIG. 13, which is a diagram of a touch keyboard 500 according to the eleventh embodiment of the present invention. In this embodiment, the touch keyboard 500 includes the plurality of keyswitches 12 and a keyboard touch electrode module 502. As shown in FIG. 13, the keyboard touch electrode module 502 includes a plurality of first electrode rows 504 and a plurality of second electrode rows 506. Each first electrode row 504 has a plurality of first electrodes 508 (preferably in a rectangle shape) electrically connected to each other in series. Each second electrode row 506 has a plurality of second electrodes 510 (preferably in a rectangle shape) electrically connected to each other in series. As shown in FIG. 13, in each key projection area 18, two adjacent first electrodes 508 and two adjacent second electrodes 510 are arranged alternately and symmetrically relative to the center of each key projection area 18. Furthermore, as shown in the lower left portion of FIG. 13 (for clearly showing the electrode arrangement angle of the first electrode row 504, the second electrode rows 506 are omitted in FIG. 13), each first electrode row 504 is an oblique electrode row arranged at the first primary angle $\theta_{23}$ (i.e. the oblique electrode connection). To be noted, the aforesaid electrode arrangement design of the first electrode row 504 could be applied to the second electrode row 506, and the related description could be reasoned by analogy according to the aforesaid description and FIG. 13 and omitted herein.

In brief, the present invention can define the sizes of the first electrode 508 and the second electrode 510 according to the aforesaid equation, so that the first electrode rows 504 and the second electrode rows 506 on the keyboard touch electrode module 502 can jointly form an electrode arrangement in which each keyswitch 12 corresponds to sixteen first electrodes 508 and sixteen second electrodes 510 and these electrodes can form a 8*4 electrode matrix. As shown in a lower right portion of FIG. 13, the 8*4 electrode matrix corresponding to each keyswitch 12 is arranged according to a primary matrix layout T19. As for the other designs (e.g. the triggering design of the keyboard touch electrode module 502) of the touch keyboard 500, the related description could be reasoned by analogy according to the first embodiment and omitted herein.

Figure 14:
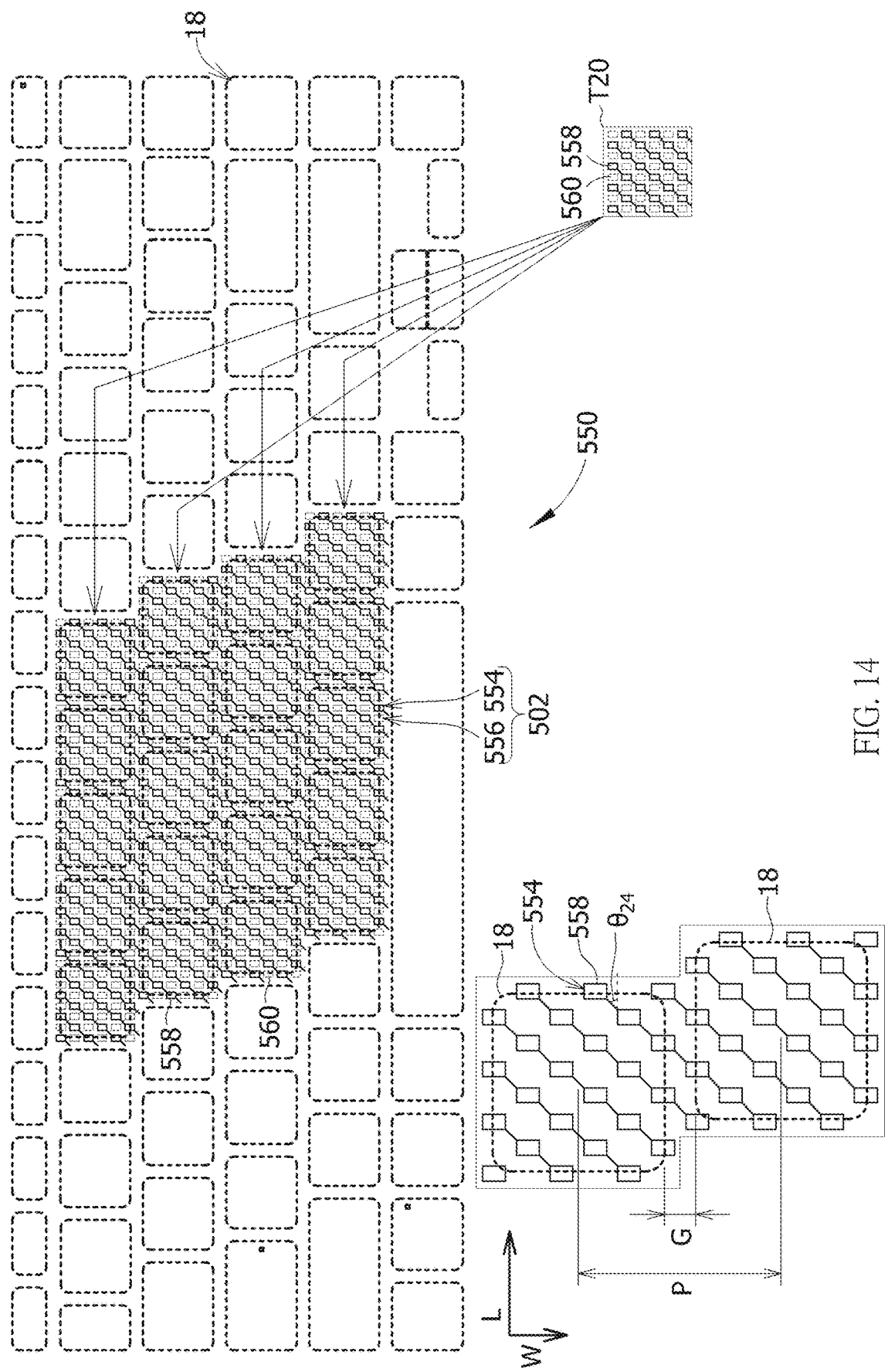
FIG. 14 is a diagram of a touch keyboard according to a twelfth embodiment of the present invention.

In the twelfth embodiment, the present invention adopts the electrode arrangement design in which each keyswitch 12 corresponds to a 8*6 electrode matrix. For example, please refer to FIG. 14, which is a diagram of a touch keyboard 550 according to the twelfth embodiment of the present invention. In this embodiment, the touch keyboard 550 includes the plurality of keyswitches 12 and a keyboard touch electrode module 552. As shown in FIG. 14, the keyboard touch electrode module 552 includes a plurality of first electrode rows 554 and a plurality of second electrode rows 556. Each first electrode row 554 has a plurality of first electrodes 558 (preferably in a rectangle shape) electrically connected to each other in series. Each second electrode row 556 has a plurality of second electrodes 560 (preferably in a rectangle shape) electrically connected to each other in series. As shown in FIG. 14, in each key projection area 18, two adjacent first electrodes 558 and two adjacent second electrodes 560 are arranged alternately and symmetrically relative to the center of each key projection area 18. Furthermore, as shown in the lower left portion of FIG. 14 (for clearly showing the electrode arrangement angle of the first electrode row 554, the second electrode rows 556 are omitted in FIG. 14), each first electrode row 554 is an oblique electrode row arranged at the first primary angle $\theta_{24}$ (i.e. the oblique electrode connection). To be noted, the aforesaid electrode arrangement design of the first electrode row 554 could be applied to the second electrode row 556, and the related description could be reasoned by analogy according to the aforesaid description and FIG. 14 and omitted herein.

In brief, the present invention can define the sizes of the first electrode 558 and the second electrode 560 according to the aforesaid equation, so that the first electrode rows 554 and the second electrode rows 556 on the keyboard touch electrode module 552 can jointly form an electrode arrangement in which each keyswitch 12 corresponds to twenty-four first electrodes 558 and twenty-four second electrodes 560 and these electrodes can form a 8*6 electrode matrix. As shown in a lower right portion of FIG. 14, the 8*6 electrode matrix corresponding to each keyswitch 12 is arranged according to a primary matrix layout T20. As for the other designs (e.g. the triggering design of the keyboard touch electrode module 552) of the touch keyboard 550, the related description could be reasoned by analogy according to the first embodiment and omitted herein.

Figure 15:
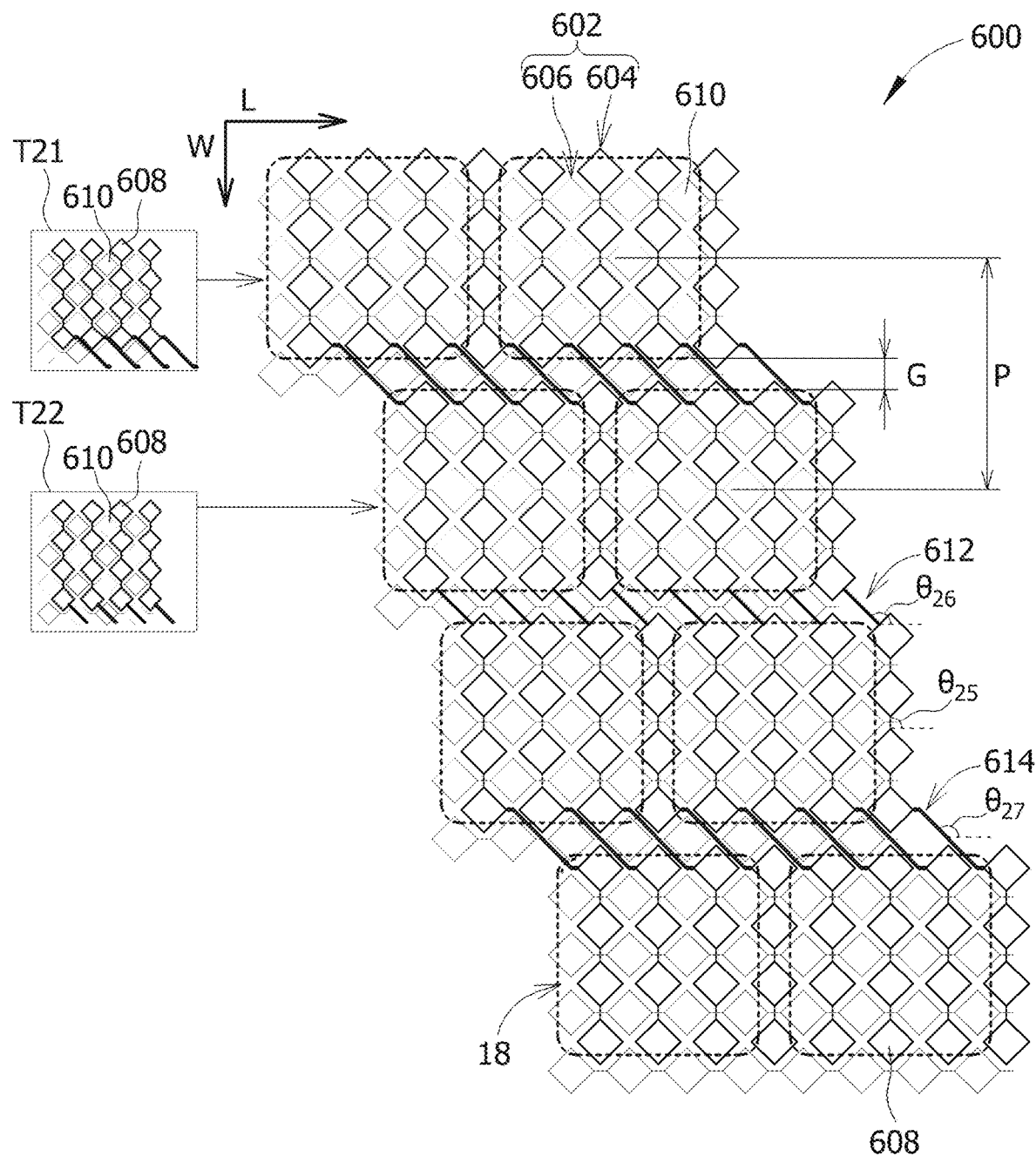
FIG. 15 is a diagram of a touch keyboard according to a thirteenth embodiment of the present invention.

In the thirteenth embodiment, the present invention adopts the rhombus electrode design in which each keyswitch 12 corresponds to two 4*4 electrode matrixes. For example, please refer to FIG. 15, which is a diagram of a touch keyboard 600 according to the thirteenth embodiment of the present invention. For clearly showing the corresponding relationships of the electrode layout of a keyboard touch electrode module 602 and the plurality of key projection areas 18, only the partial area of the keyboard touch electrode module 602 corresponding to the keyswitches 12 adopting the misalignment design is depicted on the touch keyboard 600 in FIG. 15. As for the related description for the remaining area of the keyboard touch electrode module 602, it could be reasoned by analogy according to the following description. In this embodiment, the touch keyboard 600 includes the plurality of keyswitches 12 and the keyboard touch electrode module 602. As shown in FIG. 15, the keyboard touch electrode module 602 includes a plurality of first electrode rows 604 and a plurality of second electrode rows 606. Each first electrode row 604 has a plurality of first electrodes 608 (preferably in a rhombus shape) electrically connected to each other in series. Each second electrode row 606 has a plurality of second electrodes 610 (preferably in a rhombus shape) electrically connected to each other in series. In each key projection area 18, each first electrode row 604 extends along the widthwise direction W, and each second electrode row 606 extends along the lengthwise direction L. In the key gap of each key projection area 18 in the widthwise direction W, each second electrode row 606 extends along the lengthwise direction L. In each key projection are 18, two adjacent first electrodes 608 and two adjacent second electrodes 610 are arranged alternately and symmetrically relative to the center of each key projection area 18. Furthermore, as shown in FIG. 15, each first electrode row 604 is an electrode row arranged at the first primary angle $\theta_{26}$ (i.e. the straight electrode connection). Each first electrode row 604 further includes at least one first shift section 612 arranged at a first secondary angle $\theta_{26}$ (i.e. the oblique electrode connection) and at least one first jump section 614 located in the key gap in the widthwise direction W. The first jump section 614 is arranged at a first auxiliary angle $\theta_{27}$.

In brief, the present invention can define the rhombus sizes (i.e. the rhombus long-axial and short-axial lengths) of the first electrode 608 and the second electrode 610 according to the aforesaid equation, so that the first electrode rows 604 and the second electrode rows 606 on the keyboard touch electrode module 602 can jointly form an electrode arrangement in which each keyswitch 12 corresponds to sixteen first electrodes 608 and sixteen second electrodes 610. The sixteen first electrodes 608 and the sixteen second electrodes 610 can form a 4*4 electrode matrix respectively. The first electrode row 604 includes four first electrodes 608 continuously arranged at the first primary angle $\theta_{26}$. A first electrode 608 before the four first electrodes 608 is arranged at the first secondary angle $\theta_{26}$/and a first electrode 608 after the four first electrodes 608 is arranged at the first auxiliary angle $\theta_{27}$. As shown in an upper left portion of FIG. 15, the sixteen first electrodes 608 and the sixteen second electrodes 610 corresponding to each keyswitch 12 are arranged according to a primary matrix layout T21 or a secondary matrix layout T22. As for the other designs (e.g. the triggering design of the keyboard touch electrode module 602) of the touch keyboard 600, the related description could be reasoned by analogy according to the first embodiment and omitted herein.

Figure 16:
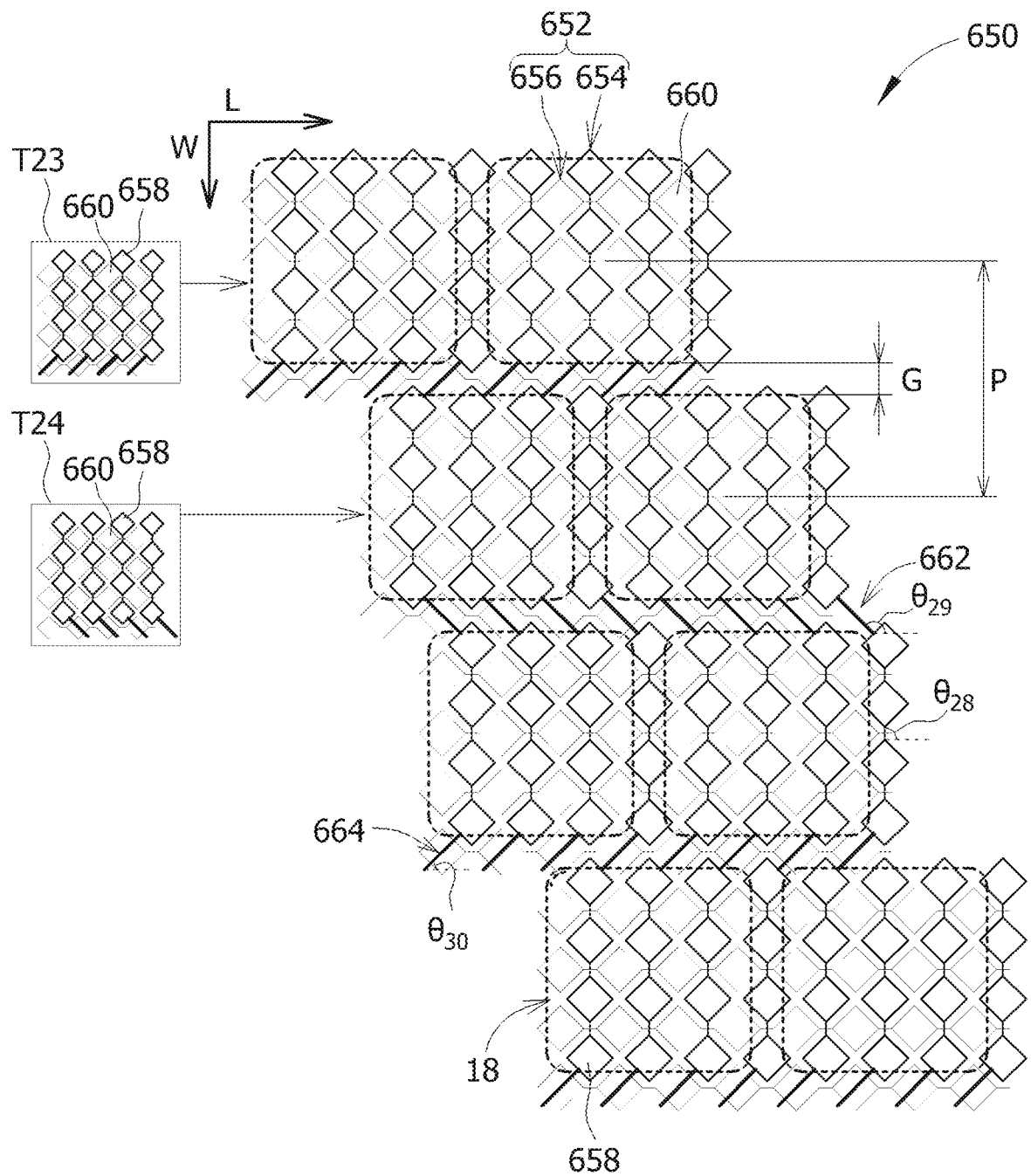
FIG. 16 is a diagram of a touch keyboard according to a fourteenth embodiment of the present invention.

In the fourteenth embodiment, the present invention adopts the rhombus electrode design in which each keyswitch 12 corresponds to two 4*4 electrode matrixes. For example, please refer to FIG. 16, which is a diagram of a touch keyboard 650 according to the fourteenth embodiment of the present invention. In this embodiment, the touch keyboard 650 includes the plurality of keyswitches 12 and a keyboard touch electrode module 652. As shown in FIG. 16, the keyboard touch electrode module 652 includes a plurality of first electrode rows 654 and a plurality of second electrode rows 656. Each first electrode row 654 has a plurality of first electrodes 658 (preferably in a rhombus shape) electrically connected to each other in series. Each second electrode row 656 has a plurality of second electrodes 660 (preferably in a rhombus shape) electrically connected to each other in series. In each key projection area 18, each first electrode row 654 extends along the widthwise direction W, and each second electrode row 656 extends along the lengthwise direction L. In the key gap of each key projection area 18 in the widthwise direction W, each second electrode row 656 extends along the lengthwise direction L. In each key projection are 18, two adjacent first electrodes 658 and two adjacent second electrodes 660 are arranged alternately and symmetrically relative to the center of each key projection area 18. Furthermore, as shown in FIG. 16, each first electrode row 654 is an electrode row arranged at the first primary angle $\theta_{28}$ (i.e. the straight electrode connection). Each first electrode row 654 further includes at least one first shift section 662 arranged at a first secondary angle $\theta_{29}$ (i.e. the oblique electrode connection) and at least one first jump section 664 located in the key gap in the widthwise direction W. The first jump section 664 is arranged at a first auxiliary angle $\theta_{30}$.

In brief, the present invention can define the rhombus sizes of the first electrode 658 and the second electrode 660 according to the aforesaid equation, so that the first electrode rows 654 and the second electrode rows 656 on the keyboard touch electrode module 652 can jointly form an electrode arrangement in which each keyswitch 12 corresponds to sixteen first electrodes 658 and sixteen second electrodes 660. The sixteen first electrodes 658 and the sixteen second electrodes 660 can form a 4*4 electrode matrix respectively. The first electrode row 654 includes four first electrodes 658 continuously arranged at the first primary angle $\theta_{28}$. A first electrode 658 before the four first electrodes 658 is arranged at the first secondary angle $\theta_{29}$, and a first electrode 658 after the four first electrodes 658 is arranged at the first auxiliary angle $\theta_{30}$. As shown in an upper left portion of FIG. 16, the sixteen first electrodes 658 and the sixteen second electrodes 660 corresponding to each keyswitch 12 are arranged according to a primary matrix layout T23 or a secondary matrix layout T24. As for the other designs (e.g. the triggering design of the keyboard touch electrode module 652) of the touch keyboard 650, the related description could be reasoned by analogy according to the first embodiment and omitted herein.

Figure 17:
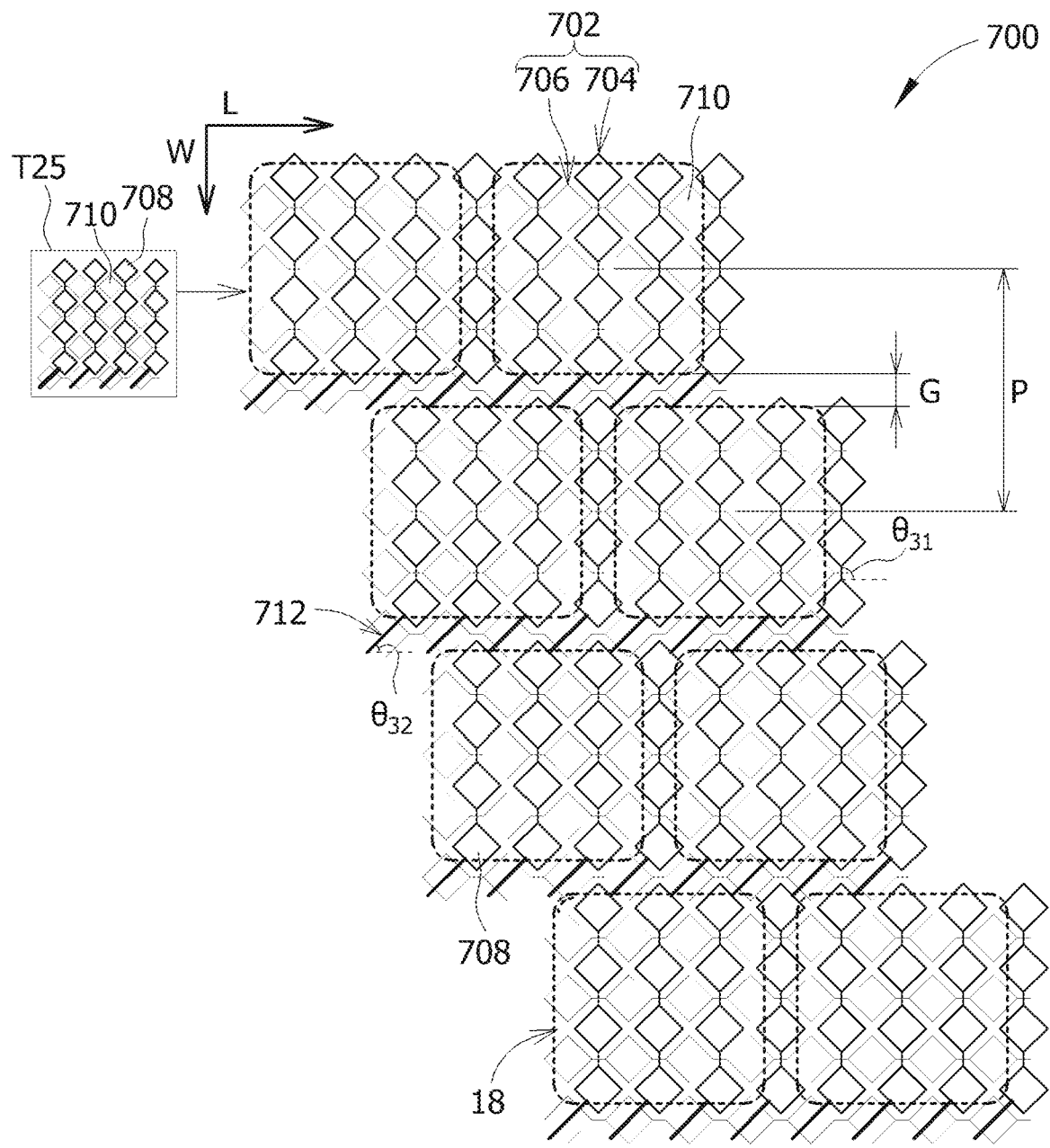
FIG. 17 is a diagram of a touch keyboard according to a fifteenth embodiment of the present invention.

In the fifteenth embodiment, the present invention adopts the rhombus electrode design in which each keyswitch 12 corresponds to two 4*4 electrode matrixes. For example, please refer to FIG. 17, which is a diagram of a touch keyboard 700 according to the fifteenth embodiment of the present invention. In this embodiment, the touch keyboard 700 includes the plurality of keyswitches 12 and a keyboard touch electrode module 702. As shown in FIG. 17, the keyboard touch electrode module 702 includes a plurality of first electrode rows 704 and a plurality of second electrode rows 706. Each first electrode row 704 has a plurality of first electrodes 708 (preferably in a rhombus shape) electrically connected to each other in series. Each second electrode row 706 has a plurality of second electrodes 710 (preferably in a rhombus shape) electrically connected to each other in series. In each key projection area 18, each first electrode row 704 extends along the widthwise direction W, and each second electrode row 706 extends along the lengthwise direction L. In the key gap of each key projection area 18 in the widthwise direction W, each second electrode row 706 extends along the lengthwise direction L. In each key projection are 18, two adjacent first electrodes 708 and two adjacent second electrodes 710 are arranged alternately and symmetrically relative to the center of each key projection area 18. Furthermore, as shown in FIG. 17, each first electrode row 704 is an electrode row arranged at the first primary angle $\theta_{31}$ (i.e. the straight electrode connection). Each first electrode row 704 further includes at least one first shift section 712 arranged at a first secondary angle $\theta_{32}$ (i.e. the oblique electrode connection).

In brief, the present invention can define the rhombus sizes of the first electrode 708 and the second electrode 710 according to the aforesaid equation, so that the first electrode rows 704 and the second electrode rows 706 on the keyboard touch electrode module 702 can jointly form an electrode arrangement in which each keyswitch 12 corresponds to sixteen first electrodes 708 and sixteen second electrodes 710. The sixteen first electrodes 708 and the sixteen second electrodes 710 can form a 4*4 electrode matrix respectively. The first electrode row 704 includes four first electrodes 708 continuously arranged at the first primary angle $\theta_{31}$. First electrodes 708 before and after the four first electrodes 708 are arranged at the first secondary angl $\theta_{32}$. As shown in an upper left portion of FIG. 17, the sixteen first electrodes 708 and the sixteen second electrodes 710 corresponding to each keyswitch 12 are arranged according to a primary matrix layout T25. As for the other designs (e.g. the triggering design of the keyboard touch electrode module 702) of the touch keyboard 700, the related description could be reasoned by analogy according to the first embodiment and omitted herein.

Figure 18:
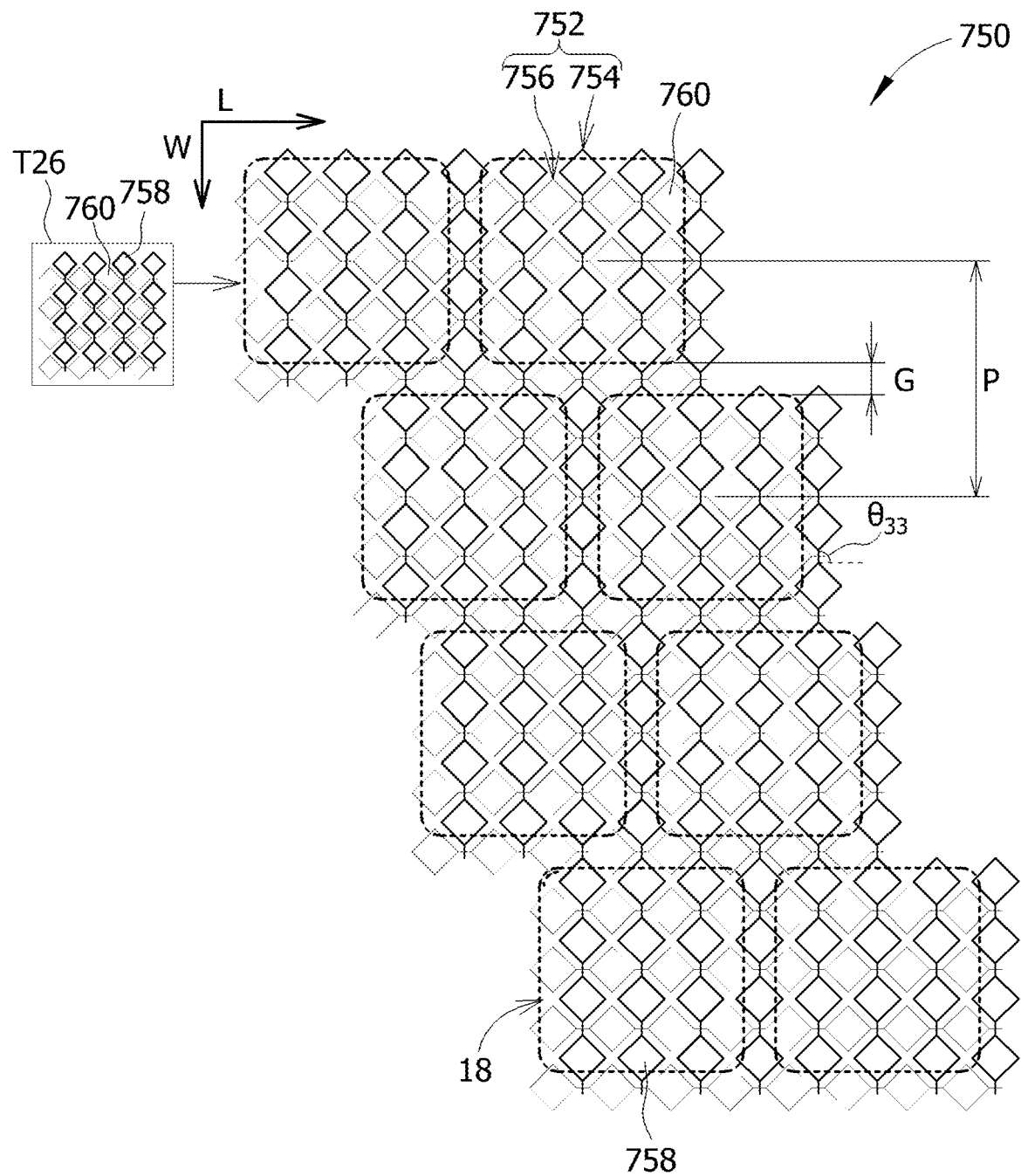
FIG. 18 is a diagram of a touch keyboard according to a sixteenth embodiment of the present invention.

In the sixteenth embodiment, the present invention adopts the rhombus electrode design in which each keyswitch 12 corresponds to two 4*4 electrode matrixes. For example, please refer to FIG. 18, which is a diagram of a touch keyboard 750 according to the sixteenth embodiment of the present invention. In this embodiment, the touch keyboard 750 includes the plurality of keyswitches 12 and a keyboard touch electrode module 752. As shown in FIG. 18, the keyboard touch electrode module 752 includes a plurality of first electrode rows 754 and a plurality of second electrode rows 756. Each first electrode row 754 has a plurality of first electrodes 758 (preferably in a rhombus shape) electrically connected to each other in series. Each second electrode row 756 has a plurality of second electrodes 760 (preferably in a rhombus shape) electrically connected to each other in series. In each key projection area 18, each first electrode row 754 extends along the widthwise direction W, and each second electrode row 756 extends along the lengthwise direction L. In the key gap of each key projection area 18 in the widthwise direction W, each second electrode row 756 extends along the lengthwise direction L. In each key projection are 18, two adjacent first electrodes 758 and two adjacent second electrodes 760 are arranged alternately and symmetrically relative to the center of each key projection area 18. Furthermore, as shown in FIG. 18, each first electrode row 754 is an electrode row arranged at the first primary angle $\theta_{33}$ (i.e. the straight electrode connection).

In brief, the present invention can define the rhombus sizes of the first electrode 758 and the second electrode 760 according to the aforesaid equation, so that the first electrode rows 754 and the second electrode rows 756 on the keyboard touch electrode module 752 can jointly form an electrode arrangement in which each keyswitch 12 corresponds to sixteen first electrodes 758 and sixteen second electrodes 760. The sixteen first electrodes 758 and the sixteen second electrodes 760 can form a 4*4 electrode matrix respectively. The sixteen first electrodes 758 and the sixteen second electrodes 760 are arranged at the first primary angle $\theta_{33}$. As shown in an upper left portion of FIG. 18, the sixteen first electrodes 758 and the sixteen second electrodes 760 corresponding to each keyswitch 12 are arranged according to a primary matrix layout T26. As for the other designs (e.g. the triggering design of the keyboard touch electrode module 752) of the touch keyboard 750, the related description could be reasoned by analogy according to the first embodiment and omitted herein.

In the present invention, adjacent key projection areas 18 in the widthwise direction W (no matter whether they are aligned with each other or not) can have at least one line of first electrodes 24/58/108/158/208/258/308/358/408/458/508/558/608/658/708/758 and corresponding second electrodes 26/60/110/160/210/260/310/360/410/460/510/560/610/660/710/760 arranged alternately in the same vertical line crossing the adjacent key projection areas 18 in the widthwise direction W. For example, as shown in FIGS. 2A/2B/2C/2D, there are three lines of first electrodes 24 and second electrodes 26 arranged alternately to form three vertical lines crossing the key projection areas 18/18a/18b adjacent along the widthwise direction W. In the present invention, there is at least one row of first electrodes 24/58/108/158/208/258/308/358/408/458/508/558/608/658/708/758 and corresponding second electrodes 26/60/110/160/210/260/310/360/410/460/510/560/610/660/710/760 arranged alternately in the same horizontal line crossing the adjacent key projection areas 18 in the lengthwise direction L. The aforesaid electrode layout in a vertical linear arrangement or a horizontal linear arrangement, which has a different direction from the first electrode rows 20/54/104/154/204/254/304/354/404/454/504/554/604/654/704/754 and the second electrode rows 22/56/106/156/206/256/306/356/406/456/506/556/606/656/706/756, can maintain the electrode arrangement regularity of the keyboard touch electrode modules 14/52/102/152/202/252/302/352/402/452/502/552/602/652/702/752. As such, the present invention can simplify the electrode layout design of the keyboard touch electrode module and improve the touch sensing regularity of the touch keyboard.

The designs of the key electrode matrixes M/Ma/Mb, the key projection areas 18/18a/18b/18c, the touch region 120, the touch-region projection 140, the key-gap layout 125, the key-gap projection layouts 143/143a/143b, the hole 141, the hole layouts 141a/141b, the key-gap electrode patterns Mg1/Mg2, and key-face electrode patterns Mf1/Mf2 mentioned in the first embodiment could be applied to the other embodiments of the present invention.

In the present invention, the first electrodes 24/58/108/158/208/258/308/358/408/458/508/558/608/658/708/758, the second electrodes 26/60/110/160/210/260/310/360/410/460/510/560/610/660/710/760, the first electrode rows 20/54/104/154/204/254/304/354/404/454/504/554/604/654/704/754, the second electrode rows 22/56/106/156/206/256/306/356/406/456/506/556/606/656/706/756, the first electrode sections 20a/20b/20c/20d/20e/20f, and the second electrode sections 22a/22b/22c/22d/22e/22f are located on the same plane, but not limited thereto. If necessary, the first electrodes 24/58/108/158/208/258/308/358/408/458/508/558/608/658/708/758, the first electrode rows 20/54/104/154/204/254/304/354/404/454/504/554/604/654/704/754, and the first electrode sections 20a/20b/20c/20d/20e/20f could be located on a first plane, and the second electrodes 26/60/110/160/210/260/310/360/410/460/510/560/610/660/710/760, the second electrode rows 22/56/106/156/206/256/306/356/406/456/506/556/606/656/706/756, and the second electrode sections 22a/22b/22c/22d/22e/22f are located on a second plane. The first plane and the second plane are parallel to each other and spaced apart from each other at a specific distance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyboard touch electrode module comprising:
a plurality of first electrode rows having a plurality of first electrodes electrically connected to each other in series; and
a plurality of second electrode rows having a plurality of second electrodes electrically connected to each other in series, the plurality of first electrode rows and the plurality of second electrode rows forming a plurality of key electrode matrixes jointly, the plurality of key electrode matrixes one-to-one corresponding to a plurality of key projection areas, the plurality of key electrode matrixes being arranged along a lengthwise direction and a widthwise direction, at least two key electrode matrixes unaligned in the widthwise direction being identical to each other, the first electrodes and the second electrodes being arranged alternately at an electrode interval;
wherein each of the first electrodes and the second electrodes of the key electrode matrixes remains intact, and all the first electrodes and the second electrodes of the adjacent key electrode matrixes jointly form an orderly-aligned integral matrix by aligning and connecting on a continuously same plane;
wherein a size of the first electrode in the widthwise direction is defined by a function of a key pitch of the key projection areas, the electrode interval, and an electrode row number covered within the key pitch.

2. The keyboard touch electrode module of claim 1, wherein a first triggering electrode of the first electrode row and a second triggering electrode of the second electrode row are extended to a center of the key projection area, and the first triggering electrode is in contact with the second triggering electrode to generate a text signal when a keycap corresponding to the key projection area is pressed to move mechanically.

3. The keyboard touch electrode module of claim 1, wherein each of the key projection areas corresponds to six first electrodes and six second electrodes, the six first electrodes and the six second electrodes form a 4*3 electrode matrix, and the 4*3 electrode matrix corresponding to said key projection area is arranged according to a primary matrix layout or a secondary matrix layout.

4. The keyboard touch electrode module of claim 1, wherein each of the key projection areas corresponds to eight first electrodes and eight second electrodes, the eight first electrodes and the eight second electrodes form a 4*4 electrode matrix, and the 4*4 electrode matrix corresponding to said key projection is arranged according to a primary matrix layout or a secondary matrix layout.

5. The keyboard touch electrode module of claim 1, wherein each of the key projection areas corresponds to ten first electrodes and ten second electrodes, the ten first electrodes and the ten second electrodes form a 4*5 electrode matrix, and the 4*5 electrode matrix corresponding to said key projection area is arranged according to a primary matrix layout or a secondary matrix layout.

6. The keyboard touch electrode module of claim 1, wherein each of the key projection areas corresponds to twelve first electrodes and twelve second electrodes, the twelve first electrodes and the twelve second electrodes form a 4*6 electrode matrix, and the 4*6 electrode matrix corresponding to said key projection area is arranged according to a primary matrix layout or a secondary matrix layout.

7. The keyboard touch electrode module of claim 1, wherein each of the key projection areas corresponds to twelve first electrodes and twelve second electrodes, the twelve first electrodes and the twelve second electrodes form a 6*4 electrode matrix, and the 6*4 electrode matrix corresponding to said key projection area is arranged according to a primary matrix layout or a secondary matrix layout.

8. The keyboard touch electrode module of claim 1, wherein each of the key projection areas corresponds to eighteen first electrodes and eighteen second electrodes, the eighteen first electrodes and the eighteen second electrodes form a 6*6 electrode matrix, and the 6*6 electrode matrix corresponding to said key projection area is arranged according to a primary matrix layout or a secondary matrix layout.

9. The keyboard touch electrode module of claim 1, wherein each of the key projection areas corresponds to nine first electrodes and nine second electrodes, the nine first electrodes and the nine second electrodes form a 6*3 electrode matrix, and the 6*3 electrode matrix corresponding to said key projection area is arranged according to a primary matrix layout or a secondary matrix layout.

10. The keyboard touch electrode module of claim 1, wherein each of the key projection areas corresponds to fifteen first electrodes and fifteen second electrodes, the fifteen first electrodes and the fifteen second electrodes form a 6*5 electrode matrix, and the 6*5 electrode matrix corresponding to said key projection area is arranged according to a primary matrix layout or a secondary matrix layout.

11. The keyboard touch electrode module of claim 1, wherein each of the key projection areas corresponds to twelve first electrodes and twelve second electrodes, the twelve first electrodes and the twelve second electrodes form a 8*3 electrode matrix, and the 8*3 electrode matrix corresponding to said key projection area is arranged according to a primary matrix layout or a secondary matrix layout.

12. The keyboard touch electrode module of claim 1, wherein each of the key projection areas corresponds to twenty first electrodes and twenty second electrodes, the twenty first electrodes and the twenty second electrodes form a 8*5 electrode matrix, and the 8*5 electrode matrix corresponding to said key projection area is arranged according to a primary matrix layout or a secondary matrix layout.

13. The keyboard touch electrode module of claim 1, wherein each key projection areas corresponds to sixteen first electrodes and sixteen second electrodes, the sixteen first electrodes and the sixteen second electrodes form a 8*4 electrode matrix, and the 8*4 electrode matrix corresponding to said key projection area is arranged according to a primary matrix layout.

14. The keyboard touch electrode module of claim 1, wherein each key projection areas corresponds to twenty-four first electrodes and twenty-four second electrodes, the twenty-four first electrodes and the twenty-four second electrodes form a 8*6 electrode matrix, and the 8*6 electrode matrix corresponding to said key projection area is arranged according to a primary matrix layout.

15. The keyboard touch electrode module of claim 1, wherein each first electrode row extends along the widthwise direction and each second electrode row extends along the lengthwise direction in each said key projection area.

16. The keyboard touch electrode module of claim 1, wherein the at least two key electrode matrixes unaligned in the widthwise direction have an identical hole layout, and the identical hole layout comprises at least one identical through hole identically located within each of said two key electrode matrixes.

17. The keyboard touch electrode module of claim 1, wherein each of the key projection areas defines a key-face electrode pattern within each said key electrode matrix, and at least two key-face electrode patterns unaligned in the widthwise direction are identical to each other.

18. The keyboard touch electrode module of claim 1, wherein a key-gap electrode pattern is defined around each said key electrode matrix, and at least two key-gap electrode patterns unaligned in the widthwise direction are identical to each other.

19. A keyboard touch electrode module for sensing a non-pressed movement of an object above a plurality of keyswitches, the keyboard touch electrode module comprising:
   a plurality of first electrode rows; and
   a plurality of second electrode rows arranged alternately with the plurality of first electrode rows to form a plurality of key electrode matrixes arranged along a lengthwise direction and a widthwise direction, each said key electrode matrix corresponding to a key projection area;
   wherein two said key electrode matrixes and two said key projection areas adjacent in the widthwise direction shift away from each other along the lengthwise direction without being aligned along the widthwise direction;
   wherein at least two said key electrode matrixes unaligned in the widthwise direction are identical to each other;
   wherein at least one portion of the first electrode row or the second electrode row comprises an oblique electrode connection with an oblique connecting direction inconsistent with a main connecting direction of the first electrode row or the second electrode row.

20. A touch keyboard comprising:

a plurality of keyswitches arranged along a lengthwise direction and along a widthwise direction into at least two rows, wherein two said keyswitches adjacent in the widthwise direction shift away from each other along the lengthwise direction without being aligned along the widthwise direction, each said keyswitch having a keycap corresponding to a key projection area, and a mechanical movement of the keycap occurs to generate a text signal when the keycap is pressed; and a keyboard touch electrode module disposed among at least one portion of the key projection areas of the keyswitches, for sensing a capacitance sensing value of a non-pressed movement of an object above the keycaps of the plurality of keyswitches to generate a touch signal, the keyboard touch electrode module comprising:

a plurality of first electrode rows having a plurality of first electrodes electrically connected to each other in series, wherein two first electrode rows adjacent in the lengthwise direction are parallel to each other; and a plurality of second electrode rows having a plurality of second electrodes electrically connected to each other in series, wherein two second electrode rows adjacent in the widthwise direction are parallel to each other, and said first electrode rows and said second electrode rows form a plurality of key electrode matrixes jointly;

wherein at least two adjacent key projection areas unaligned in the widthwise direction, respectively correspond to two said key electrode matrixes identical to each other;

wherein each of the first electrodes and the second electrodes of the key electrode matrixes remains intact, and all the first electrodes and the second electrodes of the key electrode matrixes jointly form an orderly-aligned integral matrix by aligning and connecting on a continuously same plane;

wherein sizes of said first electrodes and said second electrodes are defined by an electrode interval and a key pitch within the key projection area.

* * * * *